(12) United States Patent
Matsuoka et al.

(10) Patent No.: US 12,237,847 B2
(45) Date of Patent: Feb. 25, 2025

(54) DWA CIRCUIT AND DA CONVERSION APPARATUS

(71) Applicant: Asahi Kasei Microdevices Corporation, Tokyo (JP)

(72) Inventors: Daisuke Matsuoka, Tokyo (JP); Tatsuya Chubachi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 244 days.

(21) Appl. No.: 17/985,168

(22) Filed: Nov. 11, 2022

(65) Prior Publication Data
US 2023/0188160 A1   Jun. 15, 2023

(30) Foreign Application Priority Data

Dec. 9, 2021   (JP) .................................. 2021-200339

(51) Int. Cl.
| | |
|---|---|
| *H03M 1/00* | (2006.01) |
| *G06F 5/01* | (2006.01) |
| *H03M 1/66* | (2006.01) |
| *H03M 3/00* | (2006.01) |
| *H03M 7/16* | (2006.01) |

(52) U.S. Cl.
CPC ............. *H03M 7/165* (2013.01); *G06F 5/01* (2013.01); *H03M 1/66* (2013.01); *H03M 3/50* (2013.01)

(58) Field of Classification Search
CPC .......... H03M 7/165; H03M 1/66; H03M 3/50; H03M 3/338; H03M 3/502; G06F 5/01

USPC ........................................................ 341/126
See application file for complete search history.

(56) References Cited

U.S. PATENT DOCUMENTS

| | | | |
|---|---|---|---|
| 6,292,124 B1 | 9/2001 | Hanada | |
| 6,344,812 B1 | 2/2002 | Takeda | |
| 6,348,884 B1 | 2/2002 | Steensgaard-Madsen | |
| 7,486,210 B1 * | 2/2009 | Hong ................... | H03M 1/0665 |
| | | | 341/60 |
| 9,768,799 B1 * | 9/2017 | Yoo ........................ | H03K 19/21 |
| 10,218,380 B1 * | 2/2019 | Bal .......................... | H03M 7/14 |
| 2009/0110102 A1 | 4/2009 | Hong | |
| 2009/0243904 A1 * | 10/2009 | Lee ...................... | H03M 1/0673 |
| | | | 341/144 |

(Continued)

FOREIGN PATENT DOCUMENTS

| | | |
|---|---|---|
| JP | 5129298 B2 | 1/2013 |
| JP | 2016144032 A | 8/2016 |

*Primary Examiner* — Jean B Jeanglaude

(57) ABSTRACT

A DWA circuit includes: a thermometer conversion unit configured to convert an input digital signal into a thermometer code; a shift amount storage unit configured to store a shift amount; a shift unit configured to cyclically shift the thermometer code; an arrangement conversion unit configured to supply, to an analog output circuit, an output control code obtained by converting a bit arrangement of a shifted code; and an update unit configured to update the shift amount, in which the shifted code includes a plurality of unconverted bit fields, the output control code includes a plurality of converted bit fields, and the arrangement conversion unit is configured to perform arrangement conversions on a plurality of bits having a same position in a bit field in the plurality of unconverted bit fields, to arrange the plurality of bits in a same converted bit field among the plurality of converted bit fields.

17 Claims, 16 Drawing Sheets

(56) References Cited

U.S. PATENT DOCUMENTS

2011/0025534 A1\* 2/2011 Matsumoto ......... H03M 1/0668
  341/110
2012/0068865 A1\* 3/2012 Chae .................... H03M 1/067
  341/110

\* cited by examiner

| q2~0 | m7 | m6 | m5 | m4 | m3 | m2 | m1 | m0 |
|---|---|---|---|---|---|---|---|---|
| 000 | 0 | 0 | 0 | 0 | 0 | 0 | 0 | 1 |
| 001 | 0 | 0 | 0 | 0 | 0 | 0 | 1 | 1 |
| 010 | 0 | 0 | 0 | 0 | 0 | 1 | 1 | 1 |
| 011 | 0 | 0 | 0 | 0 | 1 | 1 | 1 | 1 |
| 100 | 0 | 0 | 0 | 1 | 1 | 1 | 1 | 1 |
| 101 | 0 | 0 | 1 | 1 | 1 | 1 | 1 | 1 |
| 110 | 0 | 1 | 1 | 1 | 1 | 1 | 1 | 1 |
| 111 | 1 | 1 | 1 | 1 | 1 | 1 | 1 | 1 |

*FIG.2*

| TIME | q2 | q1 | q0 | s0 | s1 | s2 | s3 | s4 | s5 | s6 | s7 |
|---|---|---|---|---|---|---|---|---|---|---|---|
| t01 | 0 | 0 | 0 | 1 | | | | | | | |
| t02 | 0 | 0 | 0 | | | | | | | | 1 |
| t03 | 0 | 0 | 0 | | | | | 1 | | | |
| t04 | 0 | 0 | 0 | | | | 1 | | | | |
| t05 | 0 | 0 | 0 | | 1 | | | | | | |
| t06 | 0 | 0 | 0 | | | | | | | 1 | |
| t07 | 0 | 0 | 0 | | | | | | 1 | | |
| t08 | 0 | 0 | 0 | | | 1 | | | | | |
| t01' (=t01) | 0 | 0 | 0 | 1 | | | | | | | |
| t02' (=t02) | 0 | 0 | 0 | | | | | | | | 1 |
| t03' (=t03) | 0 | 0 | 0 | | | | | 1 | | | |
| t04' (=t04) | 0 | 0 | 0 | | | | 1 | | | | |
| t05' (=t05) | 0 | 0 | 0 | | 1 | | | | | | |
| t06' (=t06) | 0 | 0 | 0 | | | | | | | 1 | |
| t07' (=t07) | 0 | 0 | 0 | | | | | | 1 | | |
| t08' (=t08) | 0 | 0 | 0 | | | 1 | | | | | |
| t01" (=t01) | 0 | 0 | 0 | 1 | | | | | | | |
| t02" (=t02) | | | | | | | | | | | |

*FIG.5*

DWA CIRCUIT AND DA CONVERSION APPARATUS

The contents of the following Japanese patent application(s) are incorporated herein by reference:
NO. 2021-200339 filed in JP on Dec. 9, 2021

BACKGROUND

1. Technical Field

The present invention relates to a DWA circuit and a DA conversion apparatus.

2. Related Art

For example, in a digital-analog conversion for audio, a delta-sigma modulator (DSM: Delta Sigma Modulator), which can suppress quantization noise in an audio band, is used. However, a mismatch of a digital-analog conversion element used in the DSM causes significant degradation of dynamic range performance. Dynamic element matching (DEM: Dynamic Element Matching) is known to improve this performance degradation.

As an example of a DEM algorithm, Data weighted averaging (DWA: Data Weighted Averaging) is known. The DWA realizes noise shaping by using a plurality of digital-analog conversion elements averagely, and reduces the degradation of a dynamic range due to the mismatch of the element. This makes it possible for the DWA to enhance a signal-to-noise ratio (SNR), and to reduce total harmonic distortion (THD).

However, even in the DWA, a tone in a band due to the mismatch of the digital-analog conversion element is generated, and the dynamic range may be degraded. In Patent Document 1, an output signal of the DWA is divided into two groups, and the two groups independently rotate to use capacitors.

PRIOR ART DOCUMENT

Patent Document

Patent Document 1: U.S. Pat. No. 2009-0110102

BRIEF DESCRIPTION OF THE DRAWINGS

FIG. 2 shows a thermometer code which is output by a thermometer conversion unit 120 according to the present embodiment.

FIG. 5 shows an example of an operation of a DWA circuit 100 according to the present embodiment.

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments necessarily have to be essential to the solution of the invention.

Figure 1:
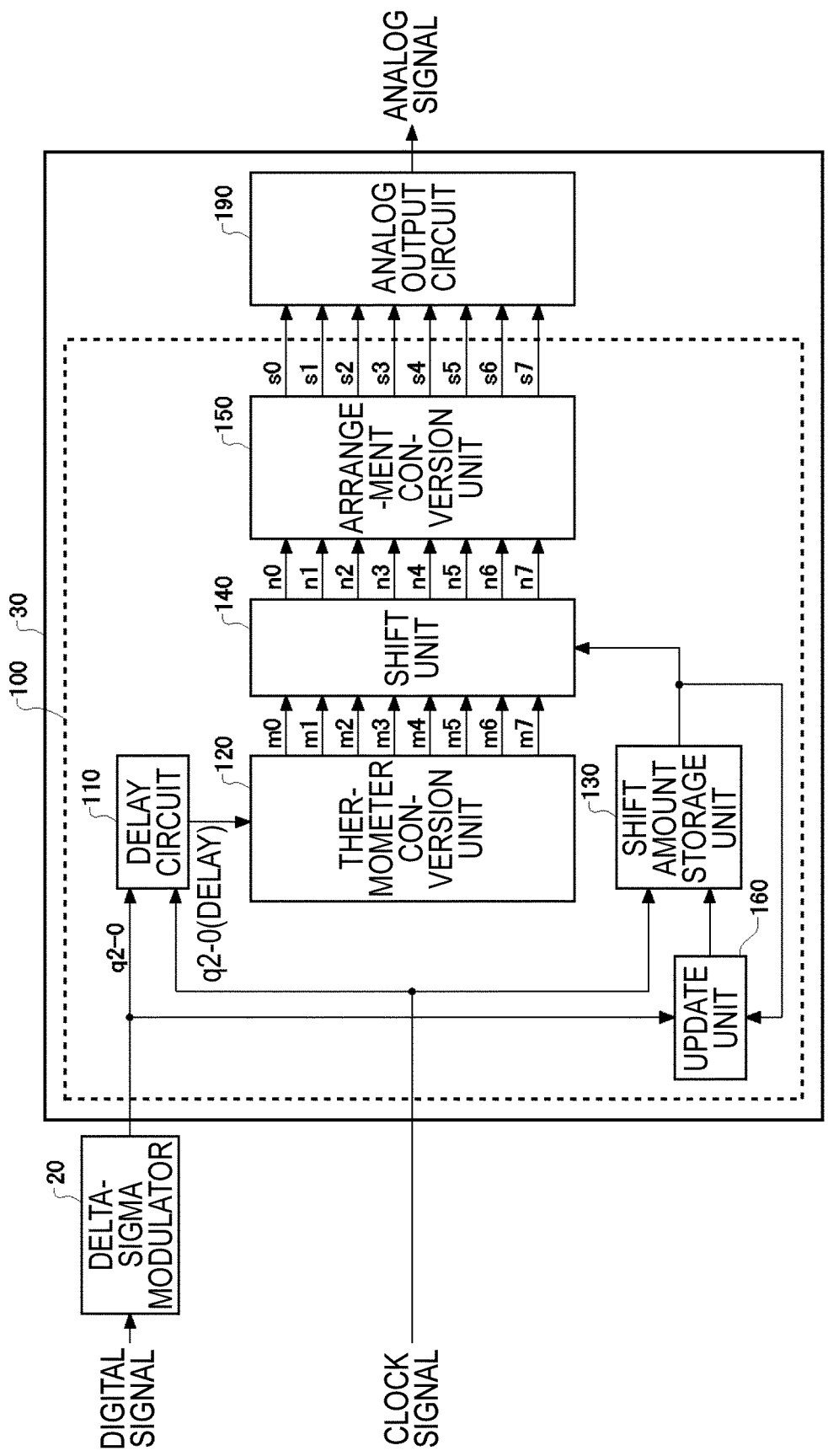
FIG. 1 shows a configuration of a delta-sigma modulation apparatus 10 according to the present embodiment.

FIG. 1 shows a configuration of a delta-sigma modulation apparatus 10 according to the present embodiment. The delta-sigma modulation apparatus 10 includes a delta-sigma modulator 20 and a DA conversion apparatus 30. The delta-sigma modulator 20 is configured to perform a delta-sigma modulation on a digital signal which is a target of a DA conversion and which is input to the delta-sigma modulation apparatus 10, and supply the modulated digital signal to the DA conversion apparatus 30. In the present embodiment, the delta-sigma modulator 20 functions as a quantizer that converts a high bit digital input signal, such as a 24-bit digital signal or a 32-bit digital signal, into a low bit digital signal (three bits in the present embodiment).

The DA conversion apparatus 30 converts the digital signal which is input from the delta-sigma modulator 20 into an analog signal. Here, in a description in relation to the DA conversion apparatus 30, the digital signal which the DA conversion apparatus 30 receives from the delta-sigma modulator 20 is referred to as an "input digital signal Q". In the present embodiment, the input digital signal Q consists of three bits of q2, q1, and q0. The DA conversion apparatus 30 converts the input digital signal Q of three bits into an analog signal of eight levels. The DA conversion apparatus 30 has a DWA circuit 100 and an analog output circuit 190.

The DWA circuit 100 receives and performs DWA processing on the input digital signal Q, and outputs an output control code S for controlling the output of an analog signal performed by the analog output circuit 190. The DWA circuit 100 has a delay circuit 110, a thermometer conversion unit 120, a shift amount storage unit 130, a shift unit 140, an arrangement conversion unit 150, and an update unit 160.

The delay circuit 110 receives the input digital signal Q from the delta-sigma modulator 20 and a clock signal. The clock signal is a signal having a clock pulse for each period of the input digital signal Q (that is, for each cycle of the input digital signal Q), and has the same clock frequency as a frequency of the input digital signal. The delay circuit 110, which may be a latch, a flip-flop, or the like, captures the input digital signal Q at a timing of the clock signal (a sampling timing which is a rising or falling timing), and outputs the captured input digital signal Q to the thermometer conversion unit 120. The DWA circuit 100 may not have the delay circuit 110, and may supply the input digital signal Q to the thermometer conversion unit 120 without delaying the input digital signal Q.

The thermometer conversion unit 120 is connected to the delay circuit 110. The thermometer conversion unit 120 is configured to convert the input digital signal Q from the delay circuit 110 into a thermometer code M. The thermometer conversion unit 120 according to the present embodiment converts the input digital signals q2 to q0 of three bits, into thermometer codes m7 to m0 of eight bits (2^3 bits). The thermometer code M has consecutive bits "1" for a number corresponding to a numerical value of the input digital signal Q. In the present embodiment, the thermometer code M is a code in which from a least significant bit m0, bits for the numerical value of the input digital signal Q+1 are "1", and remaining bits are "0".

The shift amount storage unit 130 is connected to the update unit 160. The shift amount storage unit 130 is configured to store a shift amount by which the thermometer code M is to be cyclically shifted. The shift amount storage unit 130, which may be a latch, a flip-flop, or the like, captures, at the timing of the clock signal, a next shift amount which is output by the update unit 160.

The shift unit 140 is connected to the thermometer conversion unit 120 and the shift amount storage unit 130. The shift unit 140 may be a barrel shifter, or may be a shifter using another method. The shift unit 140 is configured to cyclically shift (rotate) the thermometer code M from the thermometer conversion unit 120 by the shift amount stored in shift amount storage unit 130. Specifically, the shift unit 140 shifts the thermometer codes m7 to m0 to the left by the shift amount stored in the shift amount storage unit 130 (i.e., a shift from a lower-order bit to a higher-order bit), and circulates an overflow bit from a most significant bit to the least significant bit. For example, when the thermometer codes m7 to m0 are 0b00011111, and the shift amount is 4, the shift unit 140 outputs the shifted code 0b11110001.

From another point of view, the shift unit 140 cyclically shifts the thermometer codes m7 to m0 such that the least significant bit m0 of the thermometer code moves to a bit position specified by the shift amount. For example, when the shift amount is 4, the shift unit 140 cyclically shifts the thermometer codes m7 to m0 such that the least significant bit m0 of the thermometer code 0b00011111 moves to a bit position of m4, and outputs the shifted code 0b11110001.

The arrangement conversion unit 150 is connected to the shift unit 140. The arrangement conversion unit 150 is configured to supply, to the analog output circuit 190, output control codes S (s7 to s0) obtained by converting the bit arrangement of shifted codes N (n7 to n0) output by the shift unit 140.

The update unit 160 is connected to the shift amount storage unit 130. The update unit 160 is configured to update the shift amount stored in the shift amount storage unit 130, according to the value of the input digital signal Q from the delta-sigma modulator 20. The update unit 160 is configured to input the clock signal, and update the shift amount stored in the shift amount storage unit 130 according to the value of the input digital signal Q, at the timing of the clock signal for each period of the input digital signal Q. The update unit 160 may be realized by using adders in which the number of bits is the same as that in the input digital signals Q. In the present embodiment, the update unit 160 sets, to the next shift amount, a value obtained by adding the value of the input digital signal Q+1 to the shift amount stored in the shift amount storage unit 130, and taking a remainder by the number of bits of the thermometer code M.

For example, when the input digital signal Q is 3 (the thermometer code M is 0b00001111) and the current shift amount is 2, the shift unit 140 outputs the shifted code 0b00111100, and the update unit 160 sets the next shift amount to 6 (=2+3+1). This makes it possible for the shift unit 140 to update the shift amount of the update unit 160 such that in a next cycle, the shift amount of the update unit 160 refers to a one-bit higher position than a leftmost bit position of consecutive "1"s in the shifted code N (a rightmost bit position of remaining consecutive "0"s). In this case, in the shifted code N, bits are regarded to be circulating by the least significant bit being adjacent to an order higher than the most significant bit. This makes it possible for the DWA circuit 100 to equalize the number of times each bit of the shifted code N is "1" in the long run, by setting, to "1", the bits of which the number is specified by the input digital signal Q in order from the lower-order bit of the shifted code N for each cycle.

The analog output circuit 190 is connected to the arrangement conversion unit 150 of the DWA circuit 100. The analog output circuit 190 receives output control codes s7 to s0 from the arrangement conversion unit 150, and outputs analog signals corresponding to the output control codes s7 to s0. The analog output circuit 190 according to the present embodiment is configured to output an analog signal proportional to the number of bits having a bit value of "1" in the output control codes s7 to s0. For example, when the input digital signals q2 to q0 are 3, the analog output circuit 190 receives the output control codes s7 to s0 whose four bits are "1", and outputs an analog signal having an analog value of four units (for example, 4×a voltage of a unit voltage Vo, or 4×a current of a unit current Io).

Instead of the above configuration, the thermometer conversion unit 120 may generate a code in which from a most significant bit m7 toward the least significant bit m0, bits for the numerical value of the input digital signal Q+1 are "1", and remaining bits are "0". In this case, the shift unit 140 may circularly shift the thermometer code M to a right by the shift amount stored in the shift amount storage unit 130.

In addition, in the present specification, the thermometer codes (m7 to m0, or the like), the shifted codes (n7 to n0, or the like), and the output control codes (s7 to s0, or the like) are numbered such that higher-order bits have higher bit numbers. Instead of this, these codes may be numbered such that lower-order bits have higher bit numbers, and processing of each unit in the DA conversion apparatus 30 may be changed according to this.

FIG. 2 shows a thermometer code M (m7 to m0) which is output by a thermometer conversion unit 120 according to the present embodiment. When the input digital signal Q (q2 to q0) is 0 (0b000), the thermometer codes m7 to m0 are value 0b00000001 with "1" for one bit obtained by adding 1 to the value of the input digital signals q2 to q0 from the least significant bit.

When the input digital signals q2 to q0 are 1 (0b001), the thermometer codes m7 to m0 are value 0b00000011 with "1" for two bits (1+one bit) from the least significant bit. Similarly, when the input digital signals q2 to q0 are 2, 3, 4, 5, 6, and 7, the thermometer codes m7 to m0 are 0b00000111, 0b00001111, 0b00011111, 0b00111111, 0b01111111, and 0b11111111.

Figure 3:
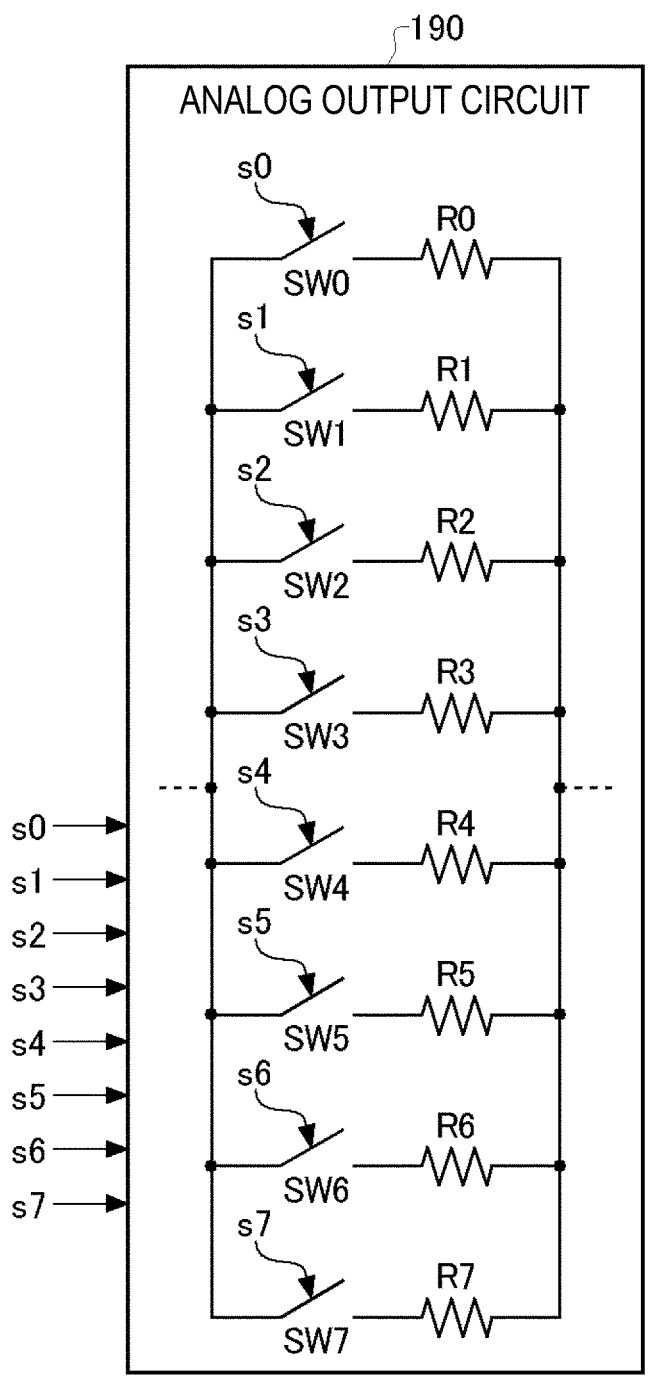
FIG. 3 shows a configuration of an analog output circuit 190 according to the present embodiment.

FIG. 3 shows a configuration of an analog output circuit 190 according to the present embodiment. The analog output circuit 190 has, for each bit of the output control code, an analog converter that outputs an analog value corresponding to a value of the bit. In the present embodiment, the analog output circuit 190 has a switched register (SR: Switched Resistor) configuration. That is, the analog output circuit 190 includes a resistor array including a plurality of resistors R0 to R7, and a plurality of switches SW0 to SW7 that is provided on a one-to-one basis with respect to the plurality of resistors R0 to R7 and that is connected in series to the corresponding resistors.

Specifically, the analog output circuit 190 has the analog converter including the switch SW0 and resistor R0 corresponding to the bit s0 of the output control code S. The switch SW0 and the resistor R0 are connected in series, and a constant voltage Vo is applied at both ends of a set of the switch SW0 and the resistor R0. The switch SW0 is turned off when the bit s0 is "0" and turned on when the bit s1 is "1". When the bit s0 is "0", no current flows through the resistor R0 (a current I0=0), and when the bit s1 is "1", the current I0=a constant voltage Vo/a resistance value R0 flows. That is, the analog converter including the switch SW0 and the resistor R0 outputs the current, as an analog value, which is 0 or the constant voltage Vo/the resistance value R0, corresponding to the value of the bit s0 of the output control code S.

The analog output circuit 190 has the analog converter including the switch SW1 and the resistor R1 corresponding to the bit s1 of the output control code S, has the analog converter including the switch SW2 and the resistor R2 corresponding to the bit s2 of the output control code S, and as the rest is similar to the above description, has the analog converter including the switch SW7 and the resistor R7 corresponding to the bit s7 of the output control code S. The resistors R0 to R7 are designed to have the same resistance value R. Accordingly, when there is no error such as a manufacturing error, each analog converter corresponding to the bits s0 to s7 of the output control code S causes the same unit current Io=Vo/R to flow in a case where the corresponding bit is "1".

The analog output circuit 190 is configured to output a sum of analog values which are output by a plurality of analog converters, as an analog signal corresponding to the input digital signal Q. In the present embodiment, the analog output circuit 190 outputs, as the analog signal, a current obtained by summing currents I7 to I0 flowing through the resistors R7 to R0. Thereby, the analog output circuit 190 ideally outputs a current proportional to the number of bits of "1" in the output control codes s7 to s0.

The analog output circuit 190 may have, instead of each of the resistors R0 to R7, a constant current source designed to cause the same current to flow. In addition, the analog output circuit 190 may have a switched capacitor (SC: Switched Capacitor) configuration. In this case, the analog output circuit 190 ideally outputs a voltage proportional to the number of bits of "1" in the output control codes s7 to s0.

Figure 4:
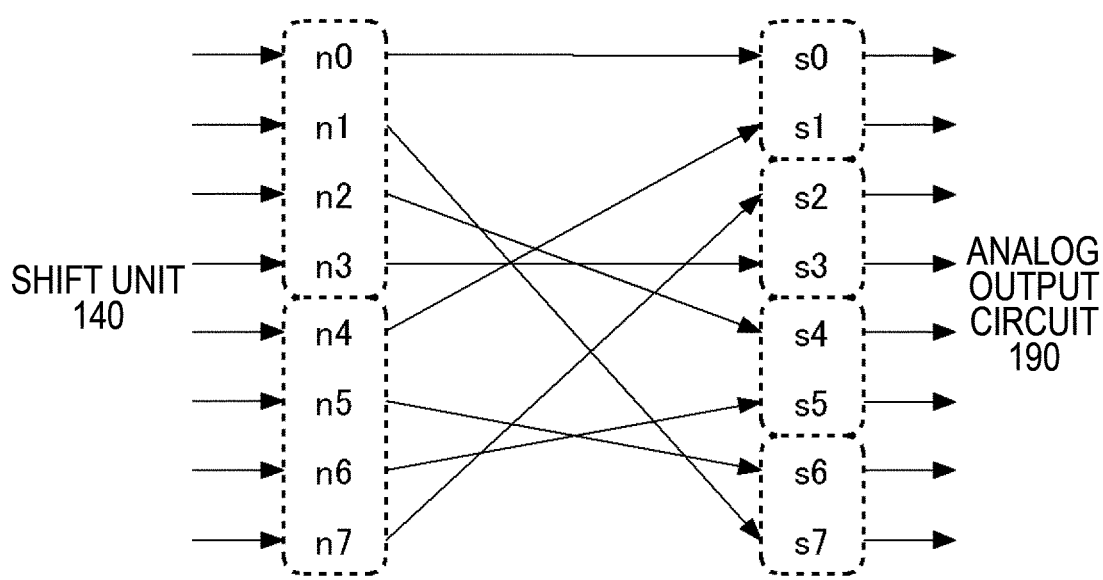
FIG. 4 shows a configuration of an arrangement conversion unit 150 according to the present embodiment.

FIG. 4 shows a configuration of an arrangement conversion unit 150 according to the present embodiment. The arrangement conversion unit 150 is configured to supply, to the analog output circuit 190, the output control codes s7 to s0 obtained by converting a bit arrangement of the shifted codes n7 to n0 which is output by the shift unit 140.

The shifted code includes two unconverted bit fields, each of which has a consecutive predetermined first number of bits. In the example of the present drawing, the shifted codes n7 to n0 include the two unconverted bit fields, each of which has four consecutive bits (n7 to n4 and n3 to n0). Here, the number (the first number) of bits in the unconverted bit field may be 75% or more of ½ of the number of bits in the shifted code, 80% or more, or 90% or more. Alternatively, the first number may be the number of bits in the shifted code/2, or may be greater than or equal to the number of bits in the shifted code/2−1.

A bit group included in the unconverted bit field is also referred to as an unconverted group. In an example of the present drawing, the shifted code N is divided into an unconverted group N1 corresponding to the unconverted bit field n7 to n4, and an unconverted group N0 corresponding to the unconverted bit field n3 to n0.

The output control code may include a plurality of converted bit fields, each of which has a consecutive predetermined second number of bits. In the example of the present drawing, the output control code S includes four converted bit fields (s7 to s6, s5 to s4, s3 to s2, and s1 to s0), each of which has two consecutive bits. The number of converted bit fields may be the same as the number of unconverted bit fields, may be greater than the number of unconverted bit fields, may be a power-of-two multiple (two times, four times, or the like) of the number of unconverted bit fields, or may be any integer of 2 or more. The converted bit field may have the number of bits (the second number) which is obtained by the number of bits of the unconverted bit field being multiplied by the number of unconverted bit fields/the number of converted bit fields. The number of bits of the converted bit field (the second number) may be greater than or equal to the number of unconverted bit fields. The second number may be the same as the first number, or may be smaller than the first number.

The bit group included in the converted bit field is also referred to as a converted group. In the example of the present drawing, the output control code S is divided into a converted group S3 corresponding to the converted bit field s7 to s6; a converted group S2 corresponding to the converted bit field s5 to s4; a converted group S1 corresponding to the converted bit field s3 to s2; and a converted group S0 corresponding to the converted bit field s1 to s0.

The arrangement conversion unit 150 performs a bit conversion to associate the plurality of bits n7 to n0 of the shifted code, with the plurality of bits s7 to s0 of the output control code on a one-to-one basis. The arrangement conversion unit 150 may have signal wiring for routing each bit of the unconverted bit field to the corresponding bit of the converted bit field.

The arrangement conversion unit 150 is configured to perform, by this routing, arrangement conversions on two bits having the same position in a bit field in the two unconverted bit fields, to arrange the two bits in the same converted bit field among the plurality of converted bit fields. In the present embodiment, the arrangement conversion unit 150 is configured to perform the arrangement conversions on the two bits having the same position in a bit field in the two unconverted bit fields, into two adjacent bits in the same converted bit field among the plurality of converted bit fields. In the example of the present drawing, both of n4 in the unconverted bit field n7 to n4, and n0 in the unconverted bit field n3 to n0 is the least significant bit in the unconverted bit field, and is the bit whose position in the bit field is the same as each other. The arrangement conversion unit 150 performs the arrangement conversions on these two bits n4 and n0, into the two adjacent bits s1 and s0 in the same converted bit field s1 to s0.

Similarly, the arrangement conversion unit 150 performs the arrangement conversions on the bits n5 and n1, which are second least significant bits in the two unconverted bit fields, into the two adjacent bits s6 and s7 in the same converted bit field s7 to s6. The arrangement conversion unit 150 performs the arrangement conversions on the bits n6 and n2, which are third least significant bits in the two unconverted bit fields, into the two adjacent bits s5 and s4 in the same converted bit field s5 to s4. The arrangement conversion unit 150 performs the arrangement conversions on the bits n7 and n3, which are fourth least significant bits in the two unconverted bit fields, into the two adjacent bits s2 and s3 in the same converted bit field s3 to s2. As a result, the arrangement conversion unit 150 converts n0, n1, n2, n3, n4, n5, n6, and n7 of the unconverted bit fields, into s0, s7, s4, s3, s1, s6, s5, and s2 of the converted bit fields.

FIG. 5 shows an example of an operation of a DWA circuit 100 according to the present embodiment. The present drawing shows, in a case where the input digital signals q2 to q0 are 0b000, the output of the DWA circuit 100 when a time passes to t01, t02, . . . .

In the example of the present drawing, the shift amount storage unit 130 stores the shift amount of 0 at the time t01. The input digital signals q2 to q0 are 0, and thus the shift unit 140 outputs "1" for one bit per cycle, like n0, n1, . . . n7, n0, n1, . . . , n7, for each cycle from the time t01, in order from the least significant bit to the most significant bit of the shifted code, and sets the least significant bit to "1" following a cycle in which the most significant bit is set to "1". As a result, the arrangement conversion unit 150 sets the output control code, which is obtained by performing the arrangement conversion on the shifted code, to "1" for one bit per cycle, like s0, s7, s4, s3, s1, s6, s5, s2, s0, s7, . . . s2, for each cycle from the time t01.

Figure 6:
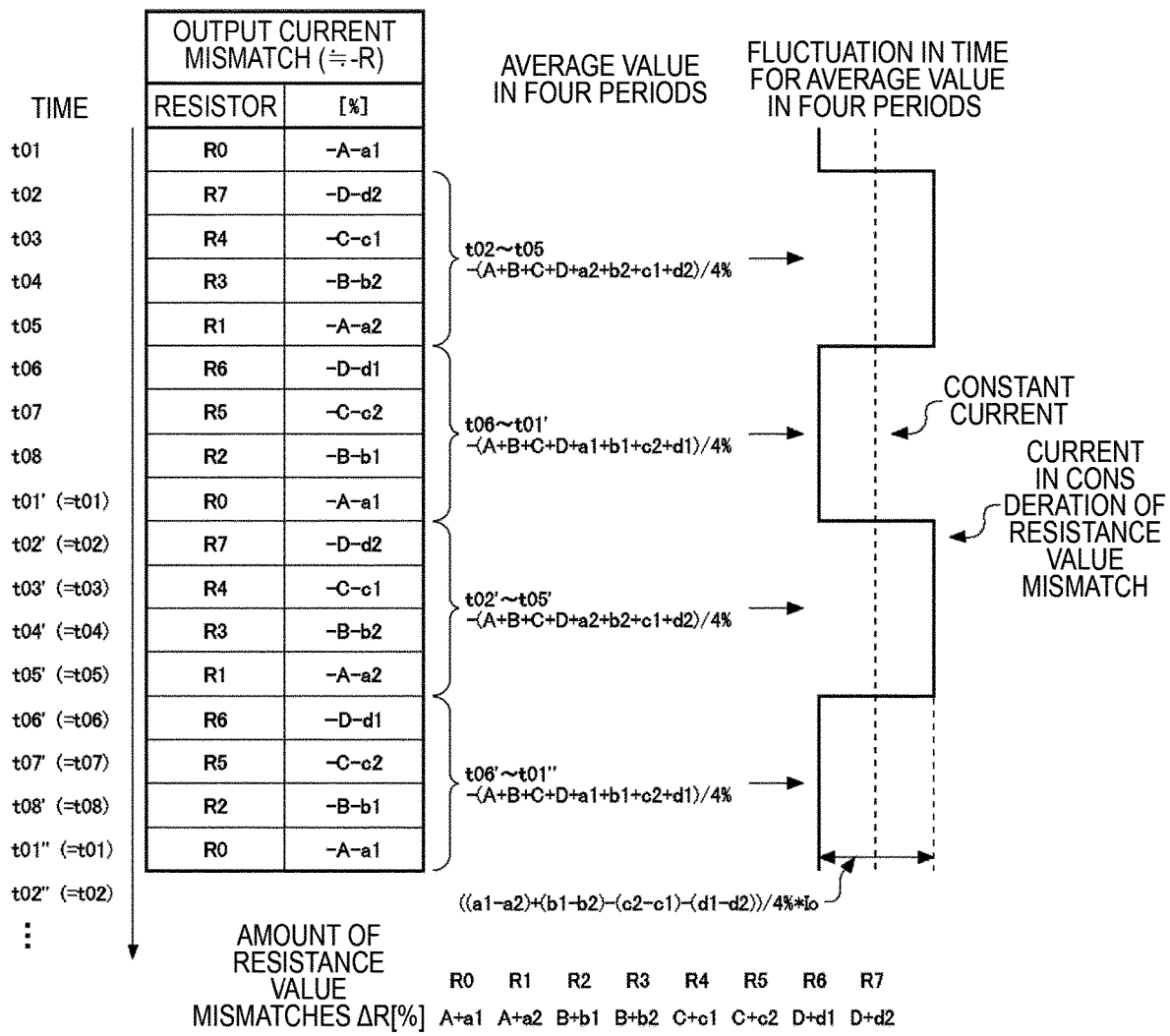
FIG. 6 shows an example of a fluctuation of an output of a DA conversion apparatus 30 according to the present embodiment.

FIG. 6 shows an example of a fluctuation of an output of a DA conversion apparatus 30 according to the present embodiment. Here, the plurality of analog converters in the analog output circuit 190 is divided into a plurality of groups, each of which has the second number of the analog converters. The plurality of groups of the analog converters corresponds to, on a one-to-one basis, the plurality of converted bit fields of the output control code S. That is, the plurality of analog converters is divided into a group 3 which is controlled by the bits s7 to s6 of the converted group S3; a group 2 which is controlled by the bits s5 to s4 of the converted group S2; a group 1 which is controlled by the bits s3 to s2 of the converted group S1; and a group 0 which is controlled by the bits s1 to s0 of the converted group S0. Accordingly, the number of groups may be, similarly to the number of converted bit fields, the same as the number of unconverted bit fields, may be a power-of-two multiple (two times, four times, or the like) of the number of unconverted bit fields, or may be any integer of 2 or more.

Each of the resistors R0 to R7 of the analog output circuit 190 has a resistance value mismatch with respect to an ideal resistance value R due to the manufacturing error or the like. When the resistance mismatches of the plurality of resistors R0 to R7 are represented separately for each group of the resistors, the resistors R0 to R7 can be respectively regarded to have, with respect to the ideal resistance value R, resistance value mismatches of (A+a1) %, (A+a2) %, (B+b1) %, (B+b2) %, (C+c1) %, (C+c2) %, (D+d1) %, and (D+d2) %. Here, A is an average value of the mismatches of the resistor R0 and the resistor R1 belonging to the group 0, and a1 and a2 respectively represent differences between the resistance mismatches of the resistor R0 and the resistor R1, and A. Similarly, B is an average value of the mismatches of the resistor R2 and the resistor R3 belonging to the group 1, and b1 and b2 respectively represent differences between the resistance mismatches of resistor R2 and the resistor R3, and B. C is an average value of the mismatches of the resistor R4 and the resistor R5 belonging to the group 2, and c1 and c2 respectively represent differences between the resistance mismatches of resistor R4 and the resistor R5, and C. D is an average value of the mismatches of the resistor R6 and the resistor R7 belonging to the group 3, and d1 and d2 respectively represent differences between the resistance mismatches of resistor R6 and the resistor R7, and D.

At the time t01, the DWA circuit 100 sets the bit s0 of the output control code S to "1", and sets the other bits to "0". Thereby, only SW0 among SW7 to SW0 in the analog output circuit 190 is turned on, and the current flowing through the resistor R0 is output as the analog signal. Here, in a case where the mismatch of the resistor R0 is (A+a1) %, the current Io flowing through the resistor R0 is inversely proportional to the resistance value, and thus can be approximated as a current having a mismatch of approximately (−A−a1) % with respect to the ideal current Io when the mismatch of the resistor R0 is small to some extent.

Similarly, at the time t02, the DWA circuit 100 sets the bit s7 of the output control code S to "1", and turns on the SW7 in the analog output circuit 190 to cause the current to flow through the resistor R7. The current I7 flowing through resistor R7 has the mismatch of approximately (−D−d2) % with respect to the ideal current Io. FIG. 6 shows such an output current mismatch for each time.

When the input digital signal Q is 0, the DWA circuit 100 sets the output control code to "1" bit by bit, and sets the same bit to "1" for every cycle for the number (eight in the present embodiment) of bits of the output control code S. Accordingly, in the present embodiment, the DA conversion apparatus 30 causes the current to flow from the same resistor repeatedly for every eight cycles.

Here, average output current mismatches, in four periods of t02 to t05, t06 to t01', t02' to t05', and t06' to t01" for every cycle (four cycles in the present embodiment) for half the number of bits of the output control code S, are respectively −(A+B+C+D+a2+b2+c1+d2)/4%, −(A+B+C+D+a1+b1+c2+d1)/4%, −(A+B+C+D+a2+b2+c1+d2)/4%, and −(A+B+C+D+a1+b1+c2+d1)/4%, when the output current is simplified to a rectangular wave as shown in FIG. 6. Accordingly, an amplitude W of the analog signal with eight cycles as one period is represented, by an estimation by using the output current mismatch for every four cycles, as the following Expression (1).

$$W=(-(A+B+C+D+a2+b2+c1+d2)/4\%)-(-(A+B+C+D+a1+b1+c2+d1)/4\%)=((a1-a2)+(b1-b2)-(c1-c2)-(d1-d2))/4\% \times Io \quad \text{(Expression 1)}$$

In the present embodiment, from the amplitude W of the analog signal with eight cycles as one period, the eight being the number of bits of the output control code S, the arrangement conversion unit 150 removes influences of the average value A of the mismatches of the resistors R0 and R1, the average value B of the mismatches of the resistors R2 and R3, the average value C of the mismatches of the resistors R4 and R5, and the average value D of the mismatches of the resistor R6 and resistor R7, by performing the arrangement conversion on the two bits having the same position in a bit field in the two unconverted bit fields, into the two adjacent bits in the same converted bit field among the plurality of converted bit fields. In the amplitude W, there remain the influences of the differences a1 and a2 between the respective mismatches of the resistors R0 and R1, and A; the differences b1 and b2 between the respective mismatches of the resistors R2 and R3, and B; the differences c1 and c2 between the respective mismatches of the resistors R4 and R5, and C; and the differences d1 and d2 between the respective mismatches of the resistors R6 and R7, and D.

It should be noted that in practice, the amplitude of the analog signal is calculated for each of periods starting from times t01, t02, t03, and t04 for a maximum amplitude to be regarded as the amplitude W of the analog signal. That is, when the amplitude of the analog signal is maximum in the period starting from the time t02, the amplitude W of the analog signal is given by the Expression (1) described above. However, even when the amplitude is calculated for any period starting from the times t01, t02, t03, and t04, similarly to the Expression (1) described above, it is possible to delete terms A, B, C, and D from the Expression for the amplitude W.

Figure 7:
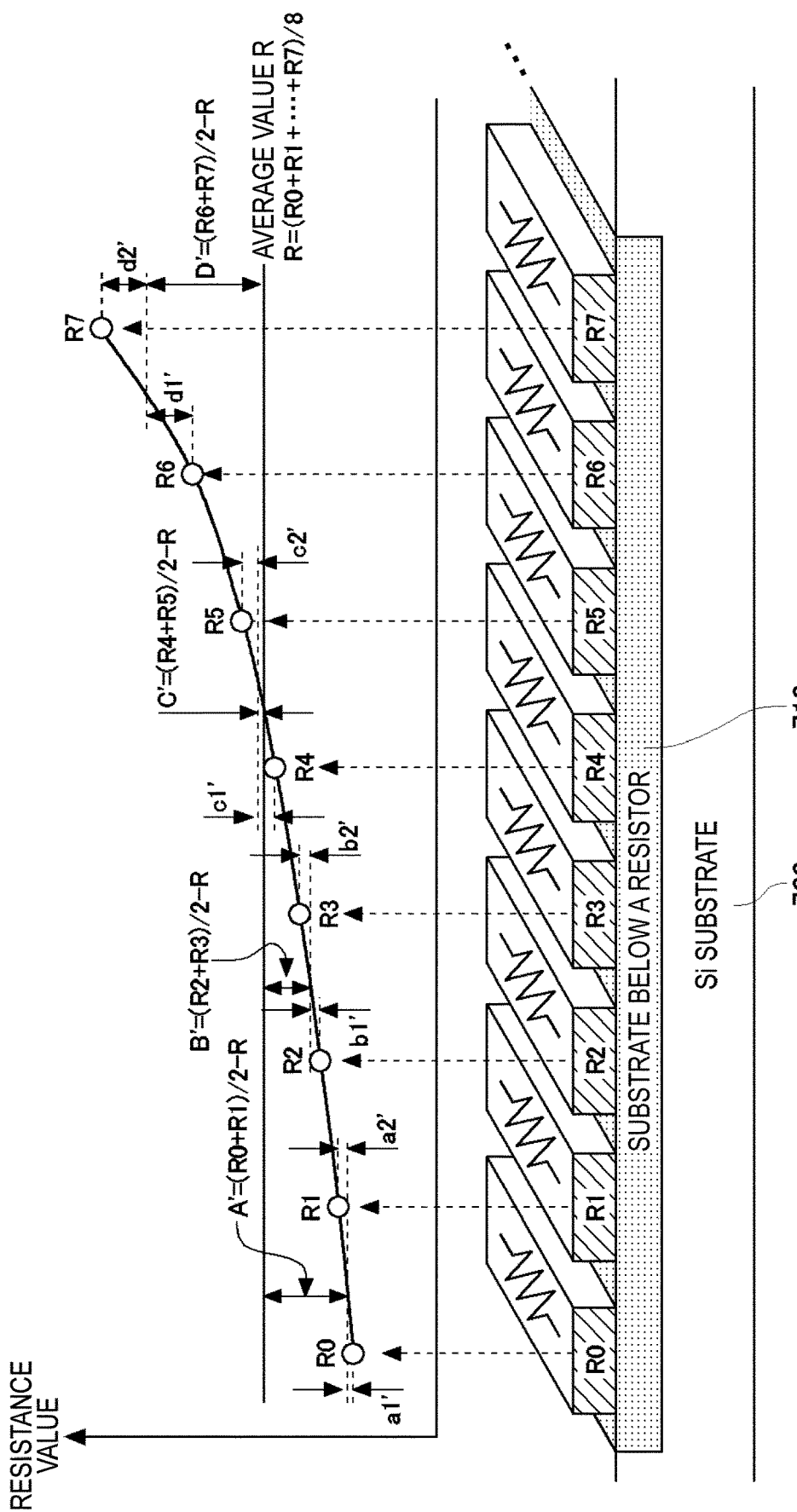
FIG. 7 shows an example of a relationship between an arrangement of resistors R0 to R7 and resistance values in the analog output circuit 190 according to the present embodiment.

FIG. 7 shows an example of a relationship between an arrangement of resistors R0 to R7 and resistance values in the analog output circuit 190 according to the present embodiment. In the example of the present drawing, the plurality of resistors R0 to R7 is formed on a substrate below a resistor 710 for a P well, an N well, a trench, or the like formed on an upper surface of a substrate 700 of silicon (Si) or the like.

Here, typically, considering a process drift in LSI manufacturing, it is assumed that a mismatch of a unit resistance value is linear. However, as in the example of the present drawing, even when the resistors R0 to R7 are arranged in parallel on the substrate below a resistor 710 to enhance matching as much as possible, the unit resistor may include a component other than the linear mismatch. Such a component of the mismatch includes, for example, a resistor width error due to a local density distribution of the polysilicon forming the resistor, a resistor height error due to local deformation of the substrate below a resistor 710, or the like. That is, the mismatches of resistors R0 to R7 are not perfectly linear by a layout environment, and may include curvilinear mismatches. In addition, the resistors R0 to R7 do not always have the same shape within a wafer plane in the LSI manufacturing, and may have variations in the curvilinear mismatches.

In the example shown in the present drawing, the substrate below a resistor 710 thickens in a non-linear manner from a resistor R0 side toward a resistor R7 side. Therefore, for the resistors R0 to R7, the closer to the resistor R0 the resistor is, the smaller the resistance value is, and the closer to the resistor R7 the resistor is, the larger the resistance value is. The average resistance value of resistors R0 to R7 is $R=(R0+R1+\ldots+R7)/8$.

When there is such a manufacturing error, among the resistors R0 to R7, the difference in resistance value is smaller in the resistors physically arranged to be adjacent to each other, than in the resistors physically arranged to be away from each other. Therefore, in the present embodiment, the adjacent resistors R0 and R1, the resistors R2 and R3, the resistors R4 and R5, and the resistors R6 and R7 are respectively grouped, and the mismatch is calculated for each group.

A difference A' between the average value of the resistance values of the resistors R0 and R1, and the resistance value R is (the resistance value R0+the resistance value R1)/2−R. Differences between the resistors R0 and R1, and the resistance value R are respectively (A'+a1') and (A'+a2'). The resistors R0 and R1 are physically arranged to be adjacent to each other, and thus are affected by the same degree of the manufacturing error, and the difference in resistance value is small. Accordingly, a1' and a2' are sufficiently smaller in comparison to A'. Mismatch (A+a1) % of the resistor R0 is a representation of (A'+a1')/R as a percentage, and the mismatch (A+a2) % of the resistor R1 is a representation of (A'+a2')/R as a percentage. As shown in the present drawing, the resistors R2 and R3, the resistors R4 and R5, and the resistors R6 and R7 are similar.

The plurality of groups of the resistors corresponds to, on a one-to-one basis, the plurality of converted groups. Accordingly, the plurality of groups of the resistors corresponds to, on a one-to-one basis, the plurality of the converted bit fields. The arrangement conversion unit 150 is configured to perform the arrangement conversions on two bits having the same position in a bit field in the two unconverted bit fields, into two bits for controlling two analog converters that are physically arranged to be adjacent to each other in the same converted bit field. This makes it possible for the DWA circuit 100 to use an analog output circuit 190 having the resistors R0 to R7 in which the closer to each other the resistors are physically arranged, the closer the resistance values are, as in the example of the present drawing, and to suppress a width of a periodic fluctuation, which occurs in the analog signal, to the amplitude W represented in the Expression (1).

In contrast to this, when it is assumed that the two bits for controlling the two analog converters physically arranged to be adjacent to each other correspond to the two bits in the same unconverted bit field, the average value A, B, C, or D of the mismatches remains in the amplitude W represented in the Expression (1). In this case, a periodic fluctuation occurring in the analog signal becomes large.

In the DA conversion apparatus 30 according to the present embodiment, even when the mismatches of the resistors R0 to R7 have the variations, it only needs to suppress the difference in resistance value having a relationship between the mismatches of the resistors respectively associated with the converted bit fields in the output control code, and there is no need of the relationship of the mismatches between the resistors associated with the different converted bit fields. Accordingly, with the DA conversion apparatus 30, instead of matching the resistance values of all the resistors included in the resistor array, it only needs to match the resistance values between the resistors in the group in which the number of resistors is (1/the number of groups of the resistors), and it is possible to reduce the matching requirement for each resistor in the resistor array in the analog output circuit 190.

In addition, in the present embodiment, when binary values, which indicate the bit positions in the shifted codes n7 to n0, are set to Nb2 to Nb0, and binary values, which indicate the bit positions in the output control codes s7 to s0, are set to Sb2 to Sb0, the relationship between the bit positions before and after conversions by the arrangement conversion unit 150 shown in FIG. 4 is as follows. Sb2=Nb1 XOR Nb0

*Sb1=Nb0*

*Sb0=Nb2*XOR *Nb0*

In this way, the arrangement conversion unit 150 in the present embodiment is configured to perform the conversion of the bit arrangement for setting a bit value, which is based on an exclusive OR of a least significant bit Nb0 and a most significant bit Nb2 of the binary values Nb2 to Nb0 indicating the bit positions in the shifted codes n7 to no, as a least significant bit Sb0 of the binary values Sb2 to Sb0 indicating the bit positions in the output control codes s7 to s0. By this conversion, the arrangement conversion unit 150 makes, in the odd-numbered converted groups S1 and S3, a switch such that the bit from the unconverted group N1 is on a lower-order side of the output control code than the bit from the unconverted group N0 is.

Here, when it is assumed that Sb0=Nb2, the arrangement conversion unit 150 performs the arrangement conversion on the bits no to n3 of the unconverted group N0, into the bits s0, s6, s4, and s2 of the output control code S, and the arrangement conversion on the bits n4 to n7 of the unconverted group N1, into the bits s1, s7, s5 and s3 of output control code S. In this case, the analog output circuit 190 outputs the currents from the resistors R0, R6, R4, and R2 in order while the bits no to n3 of the unconverted group N0 become "1" in order, and outputs the currents from the resistors R1, R7, R5, and R3 in order while the bits n4 to n7 of the unconverted group N1 become "1" in order. As shown in the present drawing, when the resistance values have relationships of R0<R1, R2<R3, R4<R5, and R6<R7, the resistance value of the resistor, through which the current flows while each bit of the unconverted group N0 is selected, may be always smaller than the resistance value of the resistor, through which the current flows while the corresponding bit of the converted group N01 is selected, and the periodic fluctuation of the analog signal may occur.

Therefore, the arrangement conversion unit 150 in the present embodiment performs, for example, by setting Sb0=Nb2 XOR Nb0, the arrangement conversion on the bits n0 to n3 of the unconverted group N0, into the bits s0, s7, s4, and s3 of the output control code S, and the arrangement conversion on the bits n4 to n7 of the unconverted group N1, into the bits s1, s6, s5 and s2 of output control code S. Thereby, the arrangement conversion unit 150 can cause the average resistance value of the resistor, through which the current flows while the unconverted group N0 is selected, to be close to the average resistance value of the resistor, through which the current flows while the unconverted group N1 is selected, and can reduce the periodic fluctuation of the analog signal.

Figure 8:
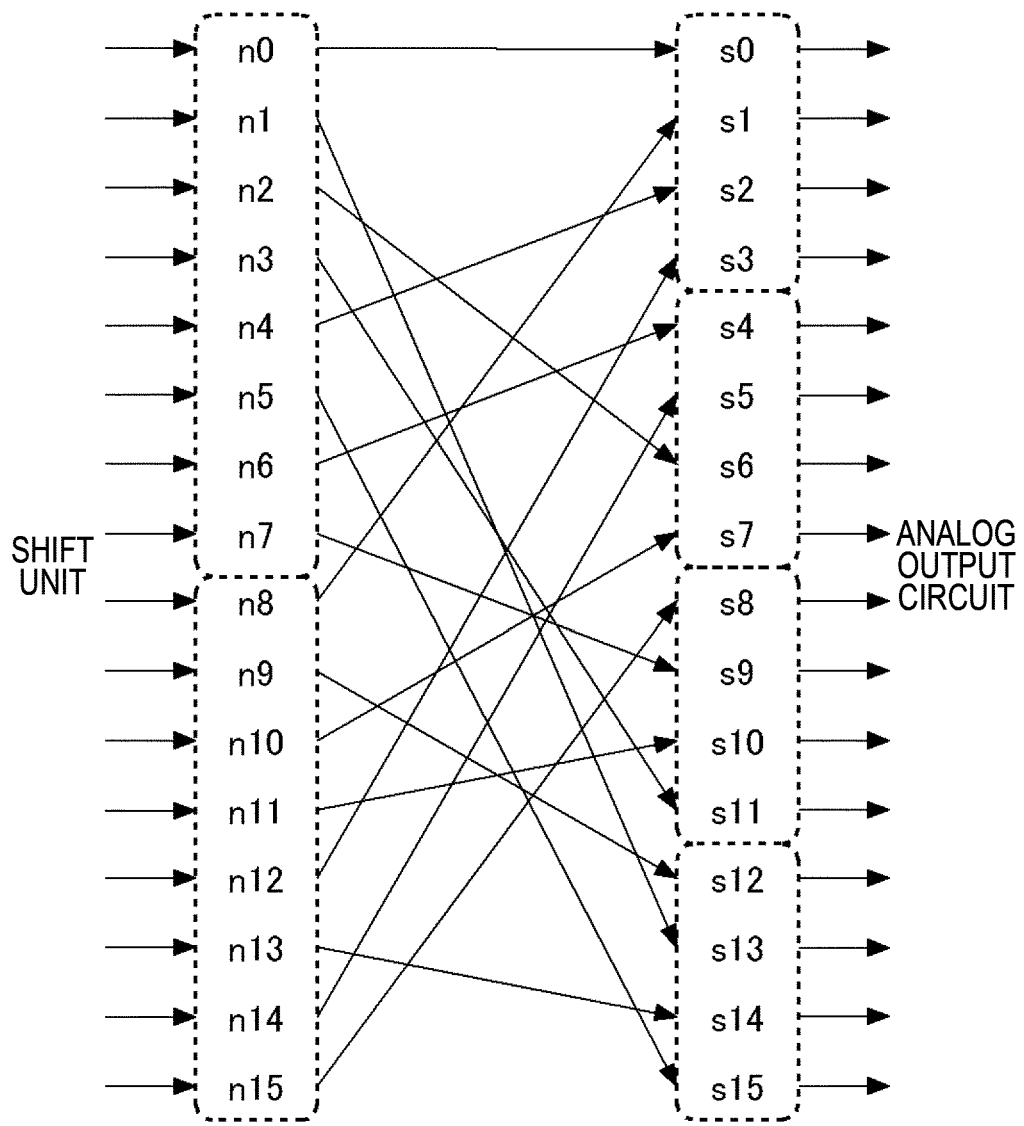
FIG. 8 shows a configuration of an arrangement conversion unit 850 according to a first modification example of the present embodiment.

FIG. 8 shows a configuration of an arrangement conversion unit 850 according to a first modification example of the present embodiment. In the present modification example, the DA conversion apparatus 30 receives the input digital signal of four bits of q3 to q0. In addition, the thermometer conversion unit 120, the shift unit 140, and the analog output circuit 190 are set to 16 bits. The arrangement conversion unit 150 in FIG. 4 is changed into the arrangement conversion unit 850 which is set to 16 bits, and in which the association between each bit of the shifted code N and each bit of the output control code S is different. Even when the thermometer code M, the shifted code N, and the output control code S are set to 16 bits, the operation of the delta-sigma modulation apparatus 10 is similar to that when these codes have eight bits, and thus the arrangement conversion unit 850 will be described below mainly on the difference.

The arrangement conversion unit 850 is configured to supply, to the analog output circuit 190, output control codes s15 to s0 obtained by converting a bit arrangement of shifted codes n15 to no output by the shift unit 140. The shifted code N includes the two unconverted bit fields, each of which has a consecutive predetermined first number of bits. In the example of the present drawing, the shifted code N includes the two unconverted bit fields, each of which has eight consecutive bits (n15 to n8, and n7 to n0). The bits n15 to n8 of the shifted code N are in the unconverted group N1, and the bits n7 to n0 are in the unconverted group N0.

The output control code S may include a plurality of converted bit fields, each of which has a consecutive predetermined second number of bits. In the example of the present drawing, the output control code S includes the four converted bit fields (s15 to s12, s11 to s8, s7 to s4, and s3 to s0), each of which has four consecutive bits. The bits s15 to s12 of the output control code S are in the converted group S3, the bits s11 to s8 are in the converted group S2, the bits s7 to s4 are in the converted group S1, and the bits s3 to s0 are in the converted group S0.

The arrangement conversion unit 850 performs the bit conversion to associate the plurality of bits n15 to no of the shifted code N, with the plurality of bits s15 to so of the output control code S on a one-to-one basis. The arrangement conversion unit 850 is configured to perform the arrangement conversions on the two bits having the same position in a bit field in the two unconverted bit fields, to arrange the two bits in the same converted bit field among the plurality of converted bit fields.

In the present modification example, the arrangement conversion unit 850 is configured to perform the arrangement conversions on the two bits having the same position in a bit field in the two unconverted bit fields, into the two adjacent bits in the same converted bit field among the plurality of converted bit fields. In the example of the present drawing, both of n8 in the unconverted bit field n15 to n8, and no in the unconverted bit field n7 to no is the least significant bit in the unconverted bit field, and is the bit whose position in the bit field is the same as each other. The arrangement conversion unit 850 performs the arrangement conversions on these two bits n8 and no into the two adjacent bits s1 and s0 in the same converted bit field s3 to s0.

Similarly, the arrangement conversion unit 850 performs the arrangement conversion on the bits n9 and n1 of the shifted code N into the bits s12 and s13 of the output control code S; performs the arrangement conversion on the bits n10 and n2 of the shifted code N into the bits s7 and s6 of the output control code S; performs the arrangement conversion on the bits n11 and n3 of the shifted code N into the bits s10 and s11 of the output control code S; performs the arrangement conversion on the bits n12 and n4 of the shifted code N into the bits s3 and s2 of the output control code S; performs the arrangement conversion on the bits n13 and n5 of the shifted code N into the bits s14 and s15 of the output control code S; performs the arrangement conversion on the bits n14 and n6 of the shifted code N into the bits s5 and s4 of the output control code S; and performs the arrangement conversion on the bits n15 and n7 of the shifted code N into the bits s8 and s9 of the output control code S.

In the present modification example, when binary values, which indicate the bit positions in the shifted codes n15 to n0, are set to Nb3 to Nb0, and binary values, which indicate the bit positions in the output control codes s15 to s0, are set to Sb3 to Sb0, the relationship between the bit positions before and after conversions is as follows.

$Sb3 = Nb0$ $Sb2 = Nb1 \text{ XOR } Nb0$ $Sb1 = Nb2 \text{ XOR } Nb1$ $Sb0 = Nb3 \text{ XOR } Nb0$ In this way, similarly to the arrangement conversion unit 150 shown in FIG. 1 to FIG. 7, the arrangement conversion unit 850 in the present modification example is configured to perform the conversion of the bit arrangement for setting a bit value, which is based on an exclusive OR of a least significant bit Nb0 and a most significant bit Nb3 of the binary values Nb3 to Nb0 indicating the bit positions in the shifted codes n15 to n0, as a least significant bit Sb0 of the binary values Sb3 to Sb0 indicating the bit positions in the output control codes s15 to s0. By this conversion, when a resistor array with a tendency similar to that in FIG. 7 is used, similarly to the arrangement conversion unit 150, the arrangement conversion unit 850 can cause the average resistance value of the resistor, through which the current flows while the unconverted group N0 is selected, to be close to the average resistance value of the resistor, through which the current flows while the unconverted group N1 is selected, and can reduce the periodic fluctuation of the analog signal.

Figure 9:
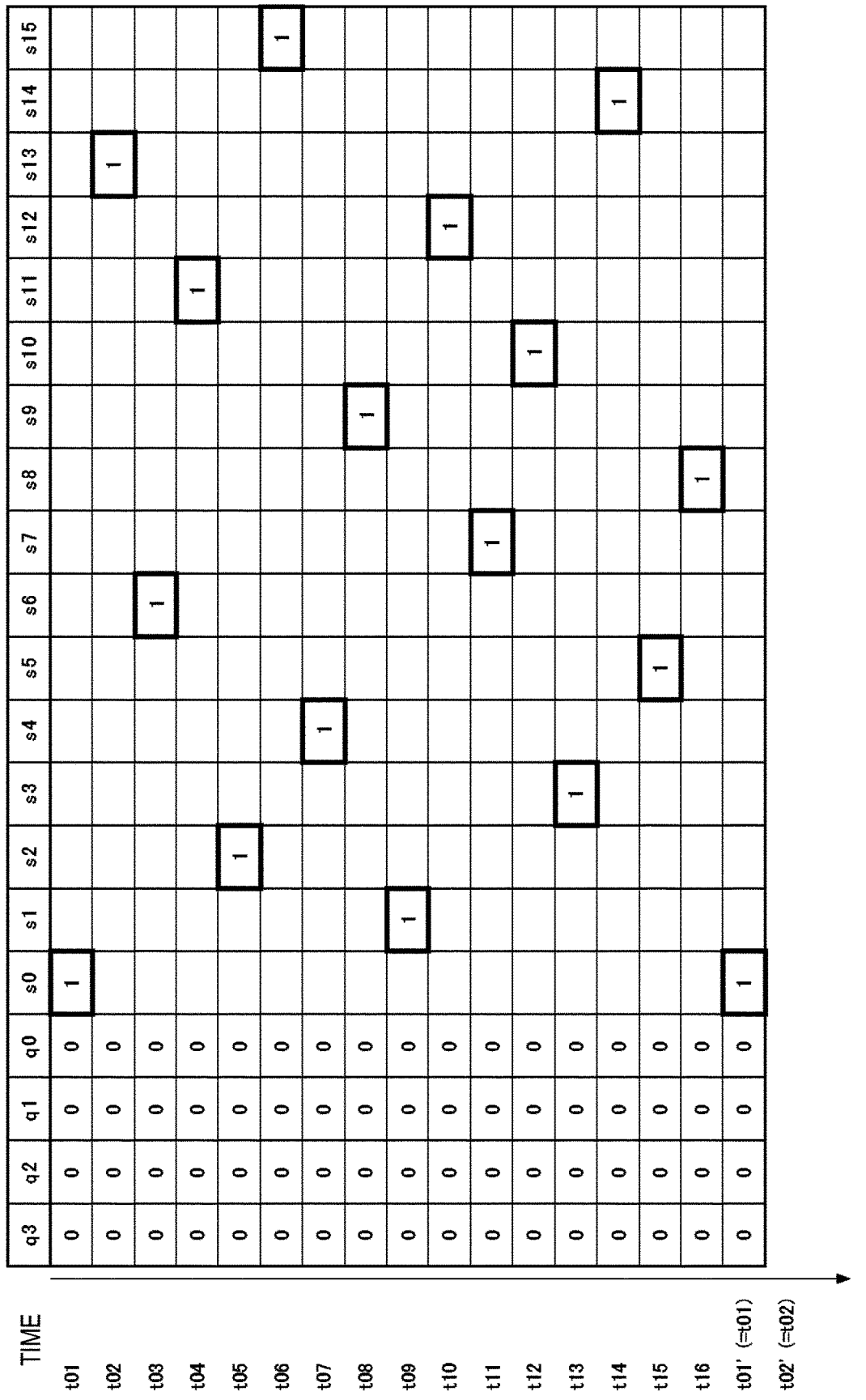
FIG. 9 shows an example of the operation of the DWA circuit 100 according to the first modification example of the present embodiment.

FIG. 9 shows an example of the operation of the DWA circuit 100 according to the first modification example of the present embodiment. The present drawing shows, in a case where the input digital signals q3 to q0 are 0b0000, the output of the DWA circuit 100 when the time passes to t01, t02, . . . .

In the example of the present drawing, the shift amount storage unit 130 stores the shift amount of 0 at the time t01. The input digital signals q3 to q0 are 0, and thus the shift unit 140 outputs "1" for one bit per cycle, like n0, n1, . . . n15, n0, n1, . . . , n15, for each cycle from the time t01, in order from the least significant bit to the most significant bit of the shifted code N, and sets the least significant bit to "1" following a cycle in which the most significant bit is set to "1". As a result, the arrangement conversion unit 850 sets the output control code S, which is obtained by performing the arrangement conversion on the shifted code N, to "1" for one bit per cycle, like s0, s13, s6, s11, s2, s15, s4, s9, s1, s12, s7, s10, s3, s14, s5, s8, s0, s13, . . . , s8, for each cycle from the time t01.

Figure 10:
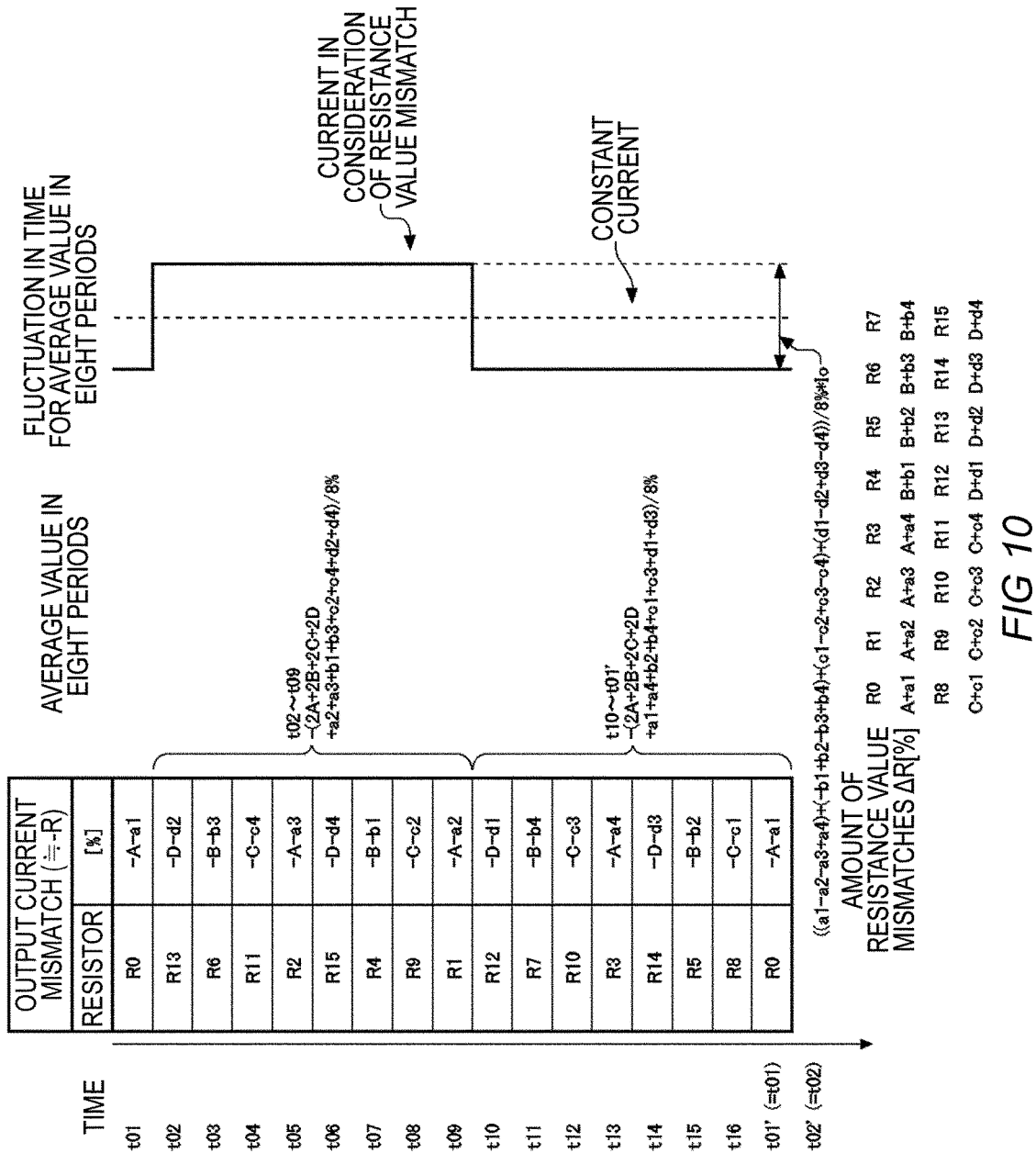
FIG. 10 shows an example of the fluctuation of the output of the DA conversion apparatus 30 according to the first modification example of the present embodiment.

FIG. 10 shows an example of the fluctuation of the output of the DA conversion apparatus 30 according to the first modification example of the present embodiment. Here, the plurality of analog converters in the analog output circuit 190 is divided into a plurality of groups by the second number (4). The plurality of groups of the analog converters corresponds to, on a one-to-one basis, the plurality of converted bit fields in the output control code S. That is, the plurality of analog converters is divided into a group 3 which is controlled by the bits s15 to s12 of the converted group S3; a group 2 which is controlled by the bits s11 to s8 of the converted group S2; a group 1 which is controlled by the bits s7 to s4 of the converted group S1; and a group 0 which is controlled by the bits s3 to s0 of the converted group S0.

Each of the resistors R0 to R15 of the analog output circuit 190 has the resistance value mismatch with respect to the ideal resistance value R due to the manufacturing error or the like. When the resistance mismatches of the plurality of resistors R0 to R15 are represented separately for each group of the resistors, the resistors R0 to R3 can be regarded to have resistance value mismatches of (A+a1 to a4) % with respect to the ideal resistance value R; the resistors R4 to R7 can be regarded to have resistance value mismatches of (B+b1 to b4) % with respect to the ideal resistance value R; the resistors R8 to R11 can be regarded to have resistance value mismatches of (C+c1 to c4) % with respect to the ideal resistance value R; and the resistors R12 to R15 can be regarded to have resistance value mismatches of (D+d1 to d4) % with respect to the ideal resistance value R.

Here, A is an average value of the mismatches of the resistors R0 to R3 belonging to the group 0, and a1 to a4 respectively represent differences between the resistance mismatches of the resistors R0 to R3, and A. Similarly, B is an average value of the mismatches of the resistors R4 to R7 belonging to the group 1, and b1 to b4 respectively represent differences between the resistance mismatches of the resistors R4 to R7, and B. C is an average value of the mismatches of the resistors R8 to R11 belonging to the group 2, and c1 to c4 respectively represent differences between the resistance mismatches of the resistors R8 to R11, and C. D is an average value of the mismatches of the resistors R12 to R15 belonging to the group 3, and d1 to d4 respectively represent differences between the resistance mismatches of the resistors R12 to R15, and D.

At the time t01, the DWA circuit 100 sets the bit s0 of the output control code S to "1", and sets the other bits to "0". Thereby, only SW0 among SW15 to SW0 in the analog output circuit 190 is turned on, and the current flowing through the resistor R0 is output as the analog signal. The mismatch of the resistor R0 is (A+a1) %, and thus the current Io flowing through the resistor R0 can be approximated as a current having a mismatch of approximately (−A−a1) % with respect to the ideal current Io.

Similarly, at the time t02, the DWA circuit 100 sets the bit s13 of the output control code S to "1", and turns on the SW13 in the analog output circuit 190 to cause the current to flow through the resistor R13. The current I13 flowing through resistor R13 has the mismatch of approximately (−D−d2) % with respect to the ideal current Io. FIG. 10 shows such an output current mismatch for each time.

When the input digital signal Q is 0, the DWA circuit 100 sets the output control code to "1" bit by bit, and sets the same bit to "1" for every cycle for the number (16 in the present modification example) of bits of the output control code S. Accordingly, in the present embodiment, the DA conversion apparatus 30 causes the current to flow from the same resistor repeatedly for every 16 cycles.

Here, average output current mismatches, in two periods of t02 to t09, and t10 to t01' for every cycle (eight cycles in the present modification example) for half the number of bits of the output control code S, are respectively −(2A+2B+2C+2D+a2+a3+b1+b3+c2+c4+d2+d4)/8% and −(2A+2B+2C+2D+a1+a4+b2+b4+c1+c3+d1+d3)/8%, as shown in FIG. 10. Accordingly, the amplitude W of the analog signal with 16 cycles as one period which starts from the time t02 can be estimated as the following Expression (2).

$$W=-(2A+2B+2C+2D+a2+a3+b1+b3+c2+c4+d2+d4)/8\%-(-(2A+2B+2C+2D+a1+a4+b2+b4+c1+c3+d1+d3)/8\%)=((a1-a2-a3+a4)+(-b1+b2-b3+b4)+(c1-c2+c3-c4)+(d1-d2+d3-d4))/8\% \times Io \quad \text{(Expression 2)}$$

In the present modification example, from the amplitude W of the analog signal with 16 cycles as one period, the 16 being the number of bits of the output control code S, the arrangement conversion unit 850 removes the influences of the average values A, B, C, and D of the mismatches of the resistors of respective groups, by performing the arrangement conversion on the two bits having the same position in a bit field in the two unconverted bit fields, into the two adjacent bits in the same converted bit field among the plurality of converted bit fields. In the amplitude W, there remain the influences of the differences a1 to a4, b1 to b4, c1 to c4, and d1 to d4 between the resistances of respective groups, and the average values of the mismatches. Here, even when the arrangement conversion unit 850 performs the arrangement conversions on the two bits having the same position in a bit field in the two unconverted bit fields, into two bits that are not adjacent to each other in the same converted bit field, it is possible to obtain the effect of removing the influences of the average values A, B, C, and D.

It should be noted that in practice, the amplitude of the analog signal is calculated for each of periods starting from times t01, t02, t03, t04, t05, t06, t07, and t08 for a maximum amplitude to be regarded as the amplitude W of the analog signal. That is, when the amplitude of the analog signal is maximum in the period starting from the time t02, the amplitude W of the analog signal is given by the Expression (2) described above. However, even when the amplitude is calculated for any period starting from any time, similarly to the Expression (2) described above, it is possible to delete the terms A, B, C, and D from the Expression for the amplitude W.

In the DA conversion apparatus 30 according to the present modification example, even when the mismatches of the resistors R0 to R15 have the variations, it only needs to suppress the difference in resistance value having a relationship between the mismatches of the resistors respectively associated with the converted bit fields in the output control code, and there is no need of the relationship of the mismatches between the resistors associated with the different converted bit fields. Accordingly, with the DA conversion apparatus 30, instead of matching the resistance values of all the resistors included in the resistor array, it only needs to match the resistance values between the resistors in the group in which the number of resistors is (1/the number of groups of the resistors), and it is possible to reduce the matching requirement for each resistor in the resistor array in the analog output circuit 190.

Figure 11:
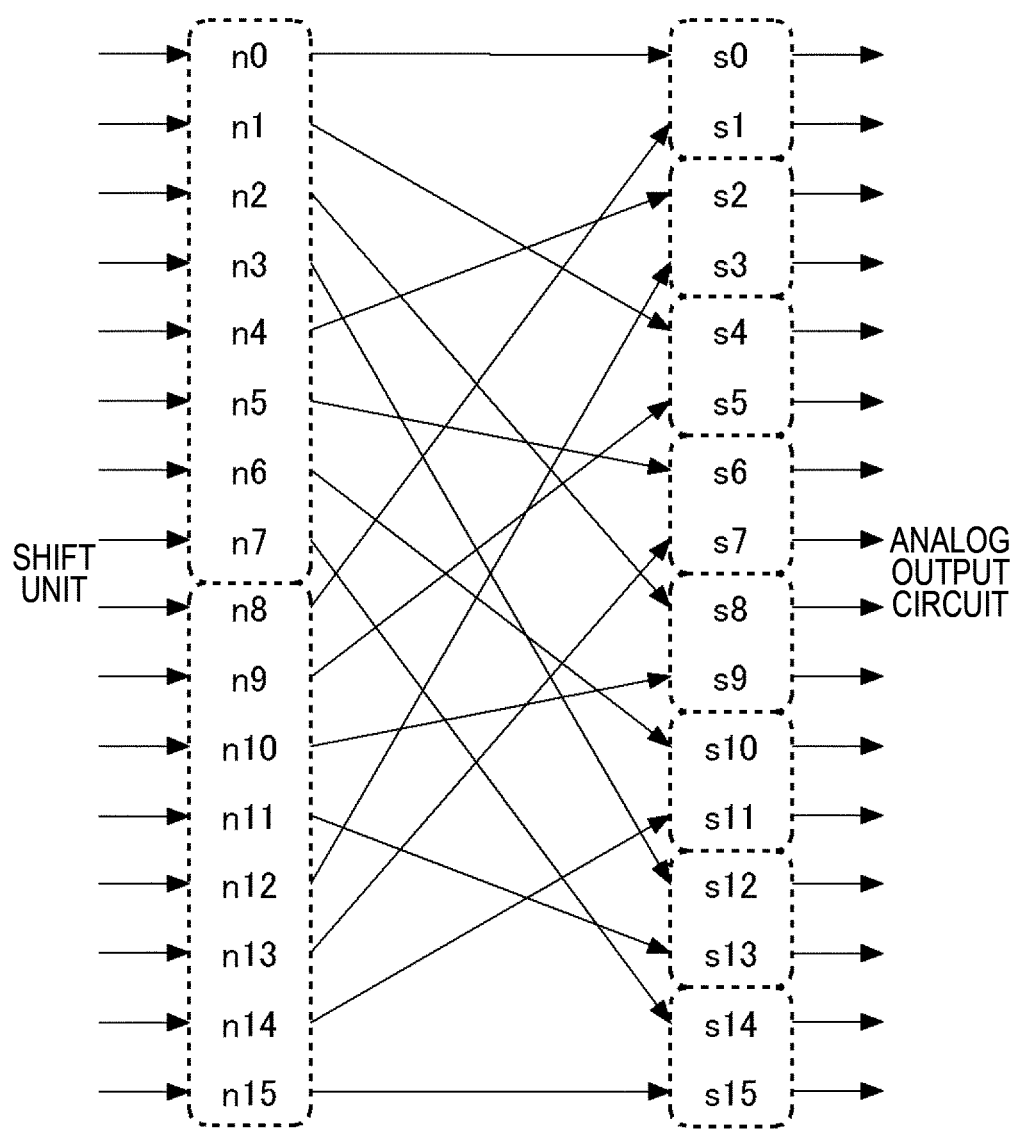
FIG. 11 shows a configuration of an arrangement conversion unit 1050 according to a second modification example of the present embodiment.

FIG. 11 shows a configuration of an arrangement conversion unit 1050 according to a second modification example of the present embodiment. The present modification example is a modification example of the arrangement conversion unit 850 shown in FIG. 8, and thus hereinafter the description will be omitted except for the differences.

The arrangement conversion unit 1050 is configured to supply, to the analog output circuit 190, the output control codes s15 to s0 obtained by converting the bit arrangement of the shifted codes n15 to no output by the shift unit 140. The shifted code N includes the two unconverted bit fields, each of which has a consecutive predetermined first number of bits. In the example of the present drawing, similarly to FIG. 8, the shifted code N includes the two unconverted bit fields, each of which has eight consecutive bits (n15 to n8, and n7 to n0). The bits n15 to n8 of the shifted code N are in the unconverted group N1, and the bits n7 to n0 are in the unconverted group N0.

The output control code S may include the plurality of converted bit fields, each of which has a consecutive predetermined second number of bits. In the example of the present drawing, the output control code S includes eight converted bit fields, each of which has two consecutive bits (s15 to s14, s13 to s12, s11 to s0, s9 to s8, s7 to s6, s5 to s4, s3 to s2, and s1 to s0). The bits s15 to s14 of the output control code S are in the converted group S7, the bits s13 to s12 are in the converted group S6, the bits s11 to s10 are in the converted group S5, and the bits s9 to s8 are in the converted group S4, the bits s7 to s6 are in the converted group S3, the bits s5 to s4 are in the converted group S2, the bits s3 to s2 are in the converted group S1, and the bits s1 to s0 are in the converted group S0.

The arrangement conversion unit 1050 performs the bit conversion to associate the plurality of bits n15 to no of the shifted code N, with the plurality of bits s15 to s0 of the output control code S on a one-to-one basis. The arrangement conversion unit 1050 is configured to perform the arrangement conversions on the two bits having the same position in a bit field in the two unconverted bit fields, to arrange the two bits in the same converted bit field among the plurality of converted bit fields. In the present modification example, the arrangement conversion unit 1050 is configured to perform the arrangement conversions on the two bits having the same position in a bit field in the two unconverted bit fields, into the two adjacent bits in the same converted bit field among the plurality of converted bit fields.

In the example of the present drawing, both of n8 in the unconverted bit field n15 to n8, and n0 in the unconverted bit field n7 to no is the least significant bit in the unconverted bit field, and is the bit whose position in the bit field is the same as each other. The arrangement conversion unit 1050 performs the arrangement conversions on these two bits n8 and n0 into the two adjacent bits s1 and s0 in the same converted bit field s1 to s0.

Similarly, the arrangement conversion unit 1050 performs the arrangement conversion on the bits n9 and n1 of the shifted code N into the bits s5 and s4 of the output control code S; performs the arrangement conversion on the bits n10 and n2 of the shifted code N into the bits s9 and s8 of the output control code S; performs the arrangement conversion on the bits n11 and n3 of the shifted code N into the bits s13 and s12 of the output control code S; performs the arrangement conversion on the bits n12 and n4 of the shifted code N into the bits s3 and s2 of the output control code S; performs the arrangement conversion on the bits n13 and n5 of the shifted code N into the bits s7 and s6 of the output control code S; performs the arrangement conversion on the bits n14 and n6 of the shifted code N into the bits s11 and s10 of the output control code S; and performs the arrangement conversion on the bits n15 and n7 of the shifted code N into the bits s15 and s14 of the output control code S.

Here, the arrangement conversion unit 1050 may perform the arrangement conversion on at least one bit pair among a plurality of bit pairs of two bits from the least significant bit in each of the plurality of unconverted bit fields, to arrange the at least one bit in the two converted bit fields, which are not adjacent to each other, among the plurality of converted bit fields. In the present modification example, the arrangement conversion unit 1050 performs the arrangement conversions on all of the bit pairs of two bits from the least significant bit in each of the plurality of unconverted bit fields, to arrange all of the bit pairs of two bits from the least significant bit, in the two converted bit fields, which are not adjacent to each other, among the plurality of converted bit fields.

In the example of the present drawing, the arrangement conversion unit 1050 respectively performs the arrangement conversions on the bit pairs of two bits (n15 and n14), (n13 and n12), (n11 and n10), (n9 and n8), (n7 and n6), (n5 and n4), (n3 and n2), and (n1 and n0) from the least significant bit in each of the unconverted bit fields n15 to n8, and n7 to no, into two sets of the converted bit fields (s15 to s14, and s11 to s10), (s7 to s6, and s3 to s2), (s13 to s12, and s9 to s8), (s5 to s4, and s1 to s0), (s15 to s14, and s11 to s10), (s7 to s6, and s3 to s2), (s13 to s12, and s9 to s8), and (s5 to s4, and s1 to s0), which are not adjacent to each other.

It should be noted that the arrangement conversion unit 150 and the arrangement conversion unit 850 also perform the arrangement conversion on at least one bit pair among a plurality of bit pairs of two bits from the least significant bit in each of the plurality of unconverted bit fields, to arrange the at least one bit pair in the two converted bit fields, which are not adjacent to each other, among the plurality of converted bit fields. Note that the arrangement conversion unit 150 and the arrangement conversion unit 850 perform the arrangement conversion on another bit pair in the unconverted bit field, to arrange the other bit pair in two adjacent converted bit fields.

In the present modification example, when binary values, which indicate the bit positions in the shifted codes n15 to no, are set to Nb3 to Nb0, and binary values, which indicate the bit positions in the output control codes s15 to s0, are set to Sb3 to Sb0, the relationship between the bit positions before and after conversions is as follows.

$$Sb3=Nb1$$

$$Sb2=Nb0$$

$$Sb1=Nb2$$

$$Sb0=Nb3$$

By performing such a conversion of the bit arrangement, similarly to the arrangement conversion unit 150 and the arrangement conversion unit 850, the arrangement conversion unit 1050 can cause the average resistance value of the resistor, through which the current flows while the unconverted group N0 is selected, to be close to the average resistance value of the resistor, through which the current flows while the unconverted group N1 is selected, and can reduce the periodic fluctuation of the analog signal. Further, also in the DA conversion apparatus 30 using the arrangement conversion unit 1050 according to the present modification example, instead of matching the resistance values of all the resistors included in the resistor array, it only needs to match the resistance values between the resistors in the group in which the number of resistors is (1/the number of groups of the resistors), and it is possible to reduce the matching requirement for each resistor in the resistor array in the analog output circuit 190.

Figure 12:
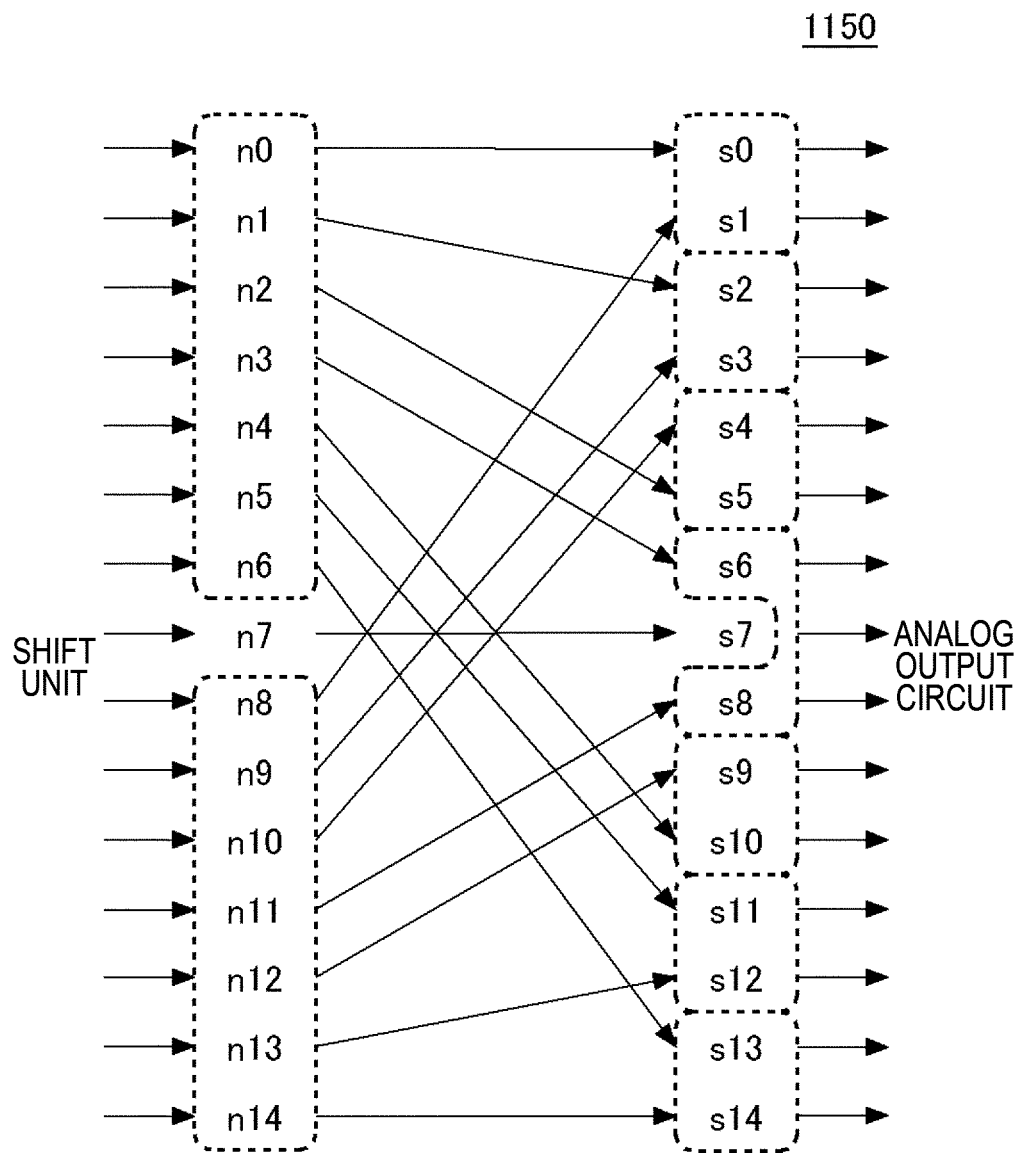
FIG. 12 shows a configuration of an arrangement conversion unit 1150 according to a third modification example of the present embodiment.

FIG. 12 shows a configuration of an arrangement conversion unit 1150 according to a third modification example of the present embodiment. In the present modification example, the DA conversion apparatus 30 receives the input digital signal of four bits of q3 to q0; however, the values are limited to a range of 0 to 14. In addition, the thermometer conversion unit 120, the shift unit 140, and the analog output circuit 190 are set to 15 bits. The arrangement conversion unit 150 in FIG. 4 is changed into the arrangement conversion unit 1150 which is set to 15 bits, and in which the association between each bit of the shifted code N and each bit of the output control code S is different. Even when the thermometer code M, the shifted code N, and the output control code S are set to 15 bits, the operation of the delta-sigma modulation apparatus 10 is similar to that when these codes have eight bits, and thus the arrangement conversion unit 1150 will be described below mainly on the difference.

The arrangement conversion unit 1150 is configured to supply, to the analog output circuit 190, the output control codes s14 to s0 obtained by converting the bit arrangement of the shifted codes n14 to no output by the shift unit 140. The shifted code N includes the two unconverted bit fields, each of which has a consecutive predetermined first number of bits. In the example of the present drawing, the shifted code N includes the two unconverted bit fields, each of which has seven consecutive bits (n14 to n8, and n6 to n0). The bits n14 to n8 of the shifted code N are in the unconverted group N1, and the bits n6 to n0 are in the unconverted group N0.

In the present modification example, the shifted code N further includes the bit n7 which does not belong to the two unconverted bit fields n14 to n8, and n6 to no. Among all of the bits of the shifted code N, the bit that does not belong to the unconverted bit field may be one bit, may be two bits, or may be less than 25% of the number of bits of the shifted code N, less than 20%, or less than 10%, or the like.

The output control code S may include the plurality of converted bit fields, each of which has a consecutive predetermined second number of bits. In the example of the present drawing, the output control code S includes seven converted bit fields, each of which has two consecutive bits (s14 to s13, s12 to s11, s10 to s9, s8 and s6, s5 to s4, s3 to s2, and s1 to s0). Note that the converted bit field consisting of s8 and s6 consists of two consecutive bits except the bit s7 which does not belong to any converted bit field. The bits s14 to s13 of the output control code S are in the converted group S6, the bits s12 to s11 are in the converted group S5, and the bits s10 to s9 are in the converted group S4, the bits s8 and s6 are in the converted group S3, the bits s5 to s4 are in the converted group S2, the bits s3 to s2 are in the converted group S1, and the bits s1 to s0 are in the converted group S0.

The arrangement conversion unit 1150 performs the bit conversion to associate the plurality of bits n14 to no of the shifted code N, with the plurality of bits s14 to s0 of the output control code S on a one-to-one basis. The arrangement conversion unit 1150 is configured to perform the arrangement conversions on the two bits having the same position in a bit field in the two unconverted bit fields, into the two adjacent bits in the same converted bit field among the plurality of converted bit fields. In the example of the present drawing, both of n8 in the unconverted bit field n14 to n8, and n0 in the unconverted bit field n6 to no is the least significant bit in the unconverted bit field, and is the bit whose position in the bit field is the same as each other. The arrangement conversion unit 1150 performs the arrangement conversions on these two bits n8 and n0 into the two adjacent bits s1 and s0 in the same converted bit field s1 to s0.

Similarly, the arrangement conversion unit 1150 performs the arrangement conversion on the bits n9 and n1 of the shifted code N into the bits s3 and s2 of the output control code S; performs the arrangement conversion on the bits n10 and n2 of the shifted code N into the bits s4 and s5 of the output control code S; performs the arrangement conversion on the bits n11 and n3 of the shifted code N into the bits s8 and s6 of the output control code S; performs the arrangement conversion on the bits n12 and n4 of the shifted code N into the bits s9 and s10 of the output control code S; performs the arrangement conversion on the bits n13 and n5 of the shifted code N into the bits s12 and s11 of the output control code S; and performs the arrangement conversion on the bits n14 and n6 of the shifted code N into the bits s14 and s13 of the output control code S. In addition, the arrangement conversion unit 1150 is configured to perform the arrangement conversion on the bit n7, which does not belong to any of the unconverted bit fields, into the bit 7 of the output control code S.

Figure 13:
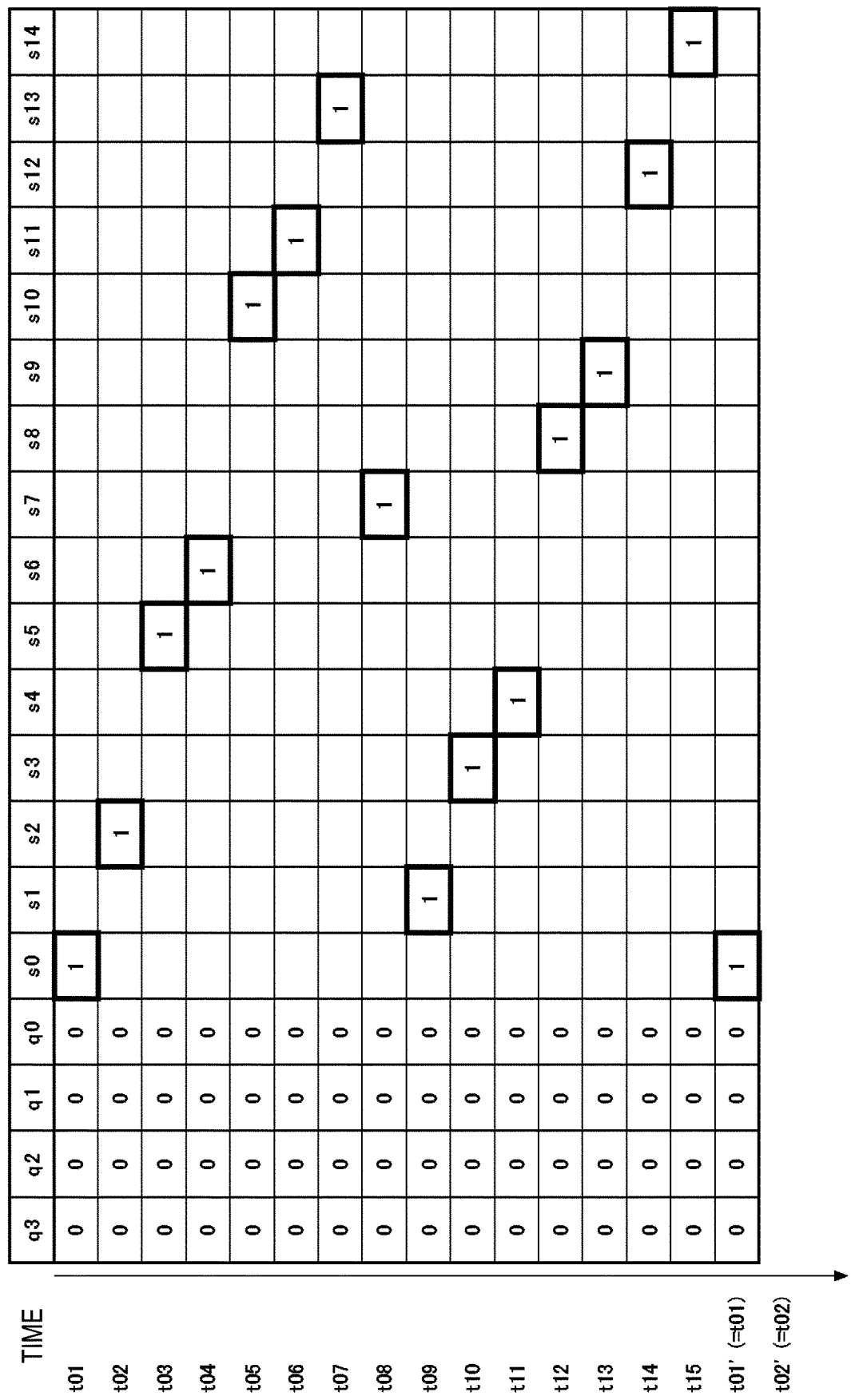
FIG. 13 shows an example of the operation of the DWA circuit 100 according to the third modification example of the present embodiment.

FIG. 13 shows an example of the operation of the DWA circuit 100 according to the third modification example of the present embodiment. The present drawing shows, in a case where the input digital signals q3 to q0 are 0b0000, the output of the DWA circuit 100 when the time passes to t01, t02, . . . .

In the example of the present drawing, the shift amount storage unit 130 stores the shift amount of 0 at the time t01. The input digital signals q3 to q0 are 0, and thus the shift unit 140 outputs "1" for one bit per cycle, like n0, n1, . . . n14, n0, n1, . . . , n14, for each cycle from the time t01, in order from the least significant bit to the most significant bit of the shifted code N, and sets the least significant bit to "1" following a cycle in which the most significant bit is set to "1". As a result, the arrangement conversion unit 1150 sets the output control code S, which is obtained by performing the arrangement conversion on the shifted code N, to "1" for one bit per cycle, like s0, s2, s5, s6, s10, s11, s13, s7, s1, s3, s4, s8, s9, s12, s14, s0, s2, . . . , s14, for each cycle from the time t01.

Figure 14:
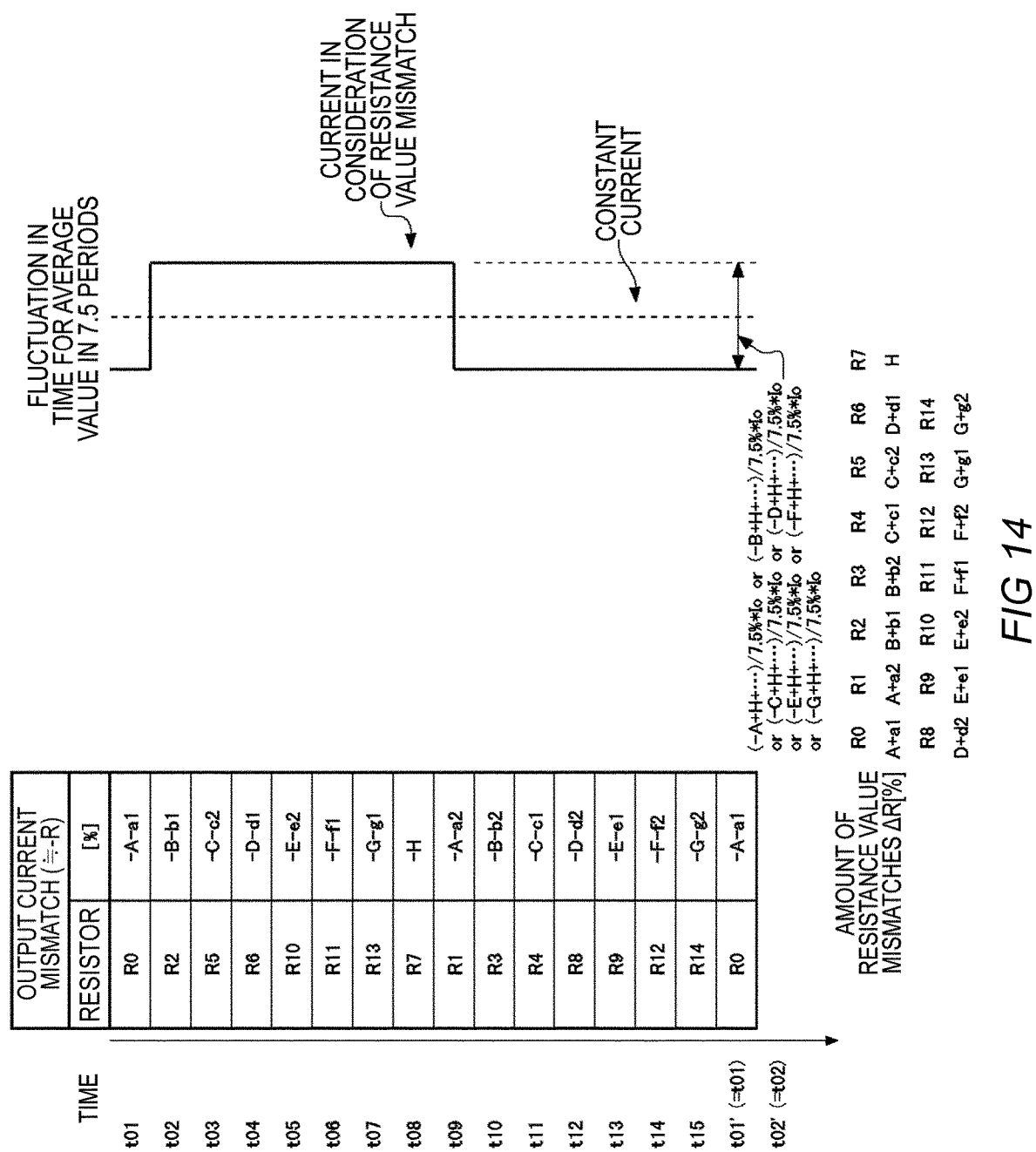
FIG. 14 shows an example of the fluctuation of the output of the DA conversion apparatus 30 according to the third modification example of the present embodiment.

FIG. 14 shows an example of the fluctuation of the output of the DA conversion apparatus 30 according to the third modification example of the present embodiment. Here, the plurality of analog converters in the analog output circuit 190 is divided into a plurality of groups by the second number (2). The plurality of groups of the analog converters corresponds to, on a one-to-one basis, the plurality of converted bit fields in the output control code S. That is, the plurality of analog converters is divided into a group 6 which is controlled by the bits s14 to s13 of the converted group S6: a group 5 which is controlled by the bits s12 to s11 of the converted group S5; a group 4 which is controlled by the bits s10 to s9 of the converted group S4; a group 3 which is controlled by the bits s8 and s6 of the converted group S3; a group 2 which is controlled by the bits s5 to s4 of the converted group S2; a group 1 which is controlled by the bits s3 to s2 of the converted group S1; and a group 0 which is controlled by the bits s1 to so of the converted group S0. In addition, the analog output circuit 190 also includes an analog converter (a set of the switch SW7 and the resistor R7) that does not belong to any analog converter group and that is controlled by the bit s7 which does not belong to any converted group.

Each of the resistors R0 to R14 of the analog output circuit 190 has the resistance value mismatch with respect to the ideal resistance value R due to the manufacturing error or the like. When the resistance mismatches of the plurality of resistors R0 to R14 are represented separately for each group of the resistors, the resistors R0 to R1 can be regarded to have resistance value mismatches of (A+a1 to a2) % with respect to the ideal resistance value R; the resistors R2 to R3 can be regarded to have resistance value mismatches of (B+b1 to b2) % with respect to the ideal resistance value R; the resistors R4 to R5 can be regarded to have resistance value mismatches of (C+c1 to c2) % with respect to the ideal resistance value R; the resistors R6 and R8 can be regarded to have resistance value mismatches of (D+d1 to d2) % with respect to the ideal resistance value R; the resistors R9 to R10 can be regarded to have resistance value mismatches of (E+e1 to e2) % with respect to the ideal resistance value R; the resistors R11 to R12 can be regarded to have resistance value mismatches of (F+f1 to f2) % with respect to the ideal resistance value R; and the resistors R13 to R14 can be regarded to have resistance value mismatches of (G+g1 to g2) % with respect to the ideal resistance value R.

Here, A is an average value of the mismatches of the resistors R0 to R1 belonging to the group 0, and a1 to a2 respectively represent differences between the resistance mismatches of the resistors R0 to R1, and A. Similarly, B is an average value of the mismatches of the resistors R2 to R3 belonging to the group 1, and b1 to b2 respectively represent differences between the resistance mismatches of the resistors R2 to R3, and B. C is an average value of the mismatches of the resistors R4 to R5 belonging to the group 2, and c1 to c2 respectively represent differences between the resistance mismatches of the resistors R4 to R5, and C. D is an average value of the mismatches of the resistors R6 and R8 belonging to the group 3, and d1 to d2 respectively represent differences between the resistance mismatches of resistors R6 and R8, and D. E is an average value of the mismatches of the resistors R9 to R10 belonging to the group 4, and e1 to e2 respectively represent differences between the resistance mismatches of the resistors R9 to R10, and E. F is an average value of the mismatches of the resistors R11 to R12 belonging to the group 5, and f1 to f2 respectively represent differences between the resistance mismatches of the resistors R11 to R12, and F. G is an average value of the mismatches of the resistors R12 and R13 belonging to the group 6, and g1 to g2 respectively represent differences between the resistance mismatches of the resistors R12 to R13, and G. It should be noted that the mismatch of resistor R7 that does not belong to any group is represented by H %.

At the time t01, the DWA circuit 100 sets the bit s0 of the output control code S to "1", and sets the other bits to "0". Thereby, only SW0 among SW14 to SW0 in the analog output circuit 190 is turned on, and the current flowing through the resistor R0 is output as the analog signal. The mismatch of the resistor R0 is (A+a1) %, and thus the current I0 flowing through the resistor R0 can be approximated as a current having a mismatch of approximately (−A−a1) % with respect to the ideal current Io.

Similarly, at the time t02, the DWA circuit 100 sets the bit s2 of the output control code S to "1", and turns on the SW2 in the analog output circuit 190 to cause the current to flow through the resistor R2. The current I2 flowing through resistor R2 has the mismatch of approximately (−B−b1) % with respect to the ideal current Io. FIG. 14 shows such an output current mismatch for each time.

When the input digital signal Q is 0, the DWA circuit 100 sets the output control code to "1" bit by bit, and sets the same bit to "1" for every cycle for the number (15 in the present modification example) of bits of the output control code S. Accordingly, in the present embodiment, the DA conversion apparatus 30 causes the current to flow from the same resistor repeatedly for every 15 cycles.

Here, average output current mismatches, in two periods of 7.5 cycles from t02, and 7.5 cycles from a timing halfway between t09 and t10 for every cycle (7.5 cycles in the present modification example) for half the number of bits of the output control code S, are respectively −(A/2+B+C+D+E+F+G+H+a2/2+b1+c2+d1+e2+f1+g1)/7.5%, −(3A/2+B+C+D+E+F+a1+a2/2+b2+c1+d2+e1+f2+g2)/7.5%, as shown in FIG. 14. Accordingly, the amplitude W of the analog signal with 15 cycles as one period which starts from the time t02 can be estimated as the following Expression (3).

$$W = (-A + H + (a1) + (-b1 + b2) + (c1 - c2) + (-d1 + d2) + (e1 - 2) + (-f1 + f2) + (-g1 + g2))/7.5\% \times Io \quad \text{Expression (3)}$$

From the amplitude W of the analog signal with 15 cycles as one period, the 15 being the number of bits of the output control code S, the arrangement conversion unit 1150 removes the influences of the average values A, B, C, and D of the mismatches of the resistors of respective groups, other than "−A+H" or the like caused by the existence of the resistor R7 that does not belong to the group, by performing the arrangement conversion on the two bits having the same position in a bit field in the two unconverted bit fields, into the two adjacent bits in the same converted bit field among the plurality of converted bit fields. Accordingly, in the amplitude W, there remain the influences of "−A+H" or the like, and the differences a1 to a2, b1 to b2, c1 to c2, d1 to d2, e1 to e2, f1 to f2, and g1 to g2 between the resistances of respective groups, and the average values of the mismatches.

It should be noted that in practice, the amplitude of the analog signal is calculated for each of periods with different start times for a maximum amplitude to be regarded as the amplitude W of the analog signal. That is, when the amplitude of the analog signal is maximum in the period starting from the time t02, the amplitude W of the analog signal is given by the Expression (3) described above. As shown in FIG. 14, when the start time of one period is different, the "−A+H" part of the Expression (3) is changed to "−B+H", "−C+H", "−D+H", "−E+H", "−F+H", "−G+H", and the like. Accordingly, even when the amplitude is calculated for any period starting from any time, similarly to the Expression (3) described above, it is possible to delete the terms A, B, C, and D, except for "−A+H" and the like, from the Expression for the amplitude W.

Accordingly, in the DA conversion apparatus 30 according to the present modification example, even when there exists the resistor R7 that does not belong to the group of the resistors, it only needs to match, in addition to matching the resistance values between the resistors for the respective groups, the resistance value between the resistor R7, which does not belong to the group, and another resistor, and it is possible to reduce requirements for matching the resistors between the different groups.

Figure 15:
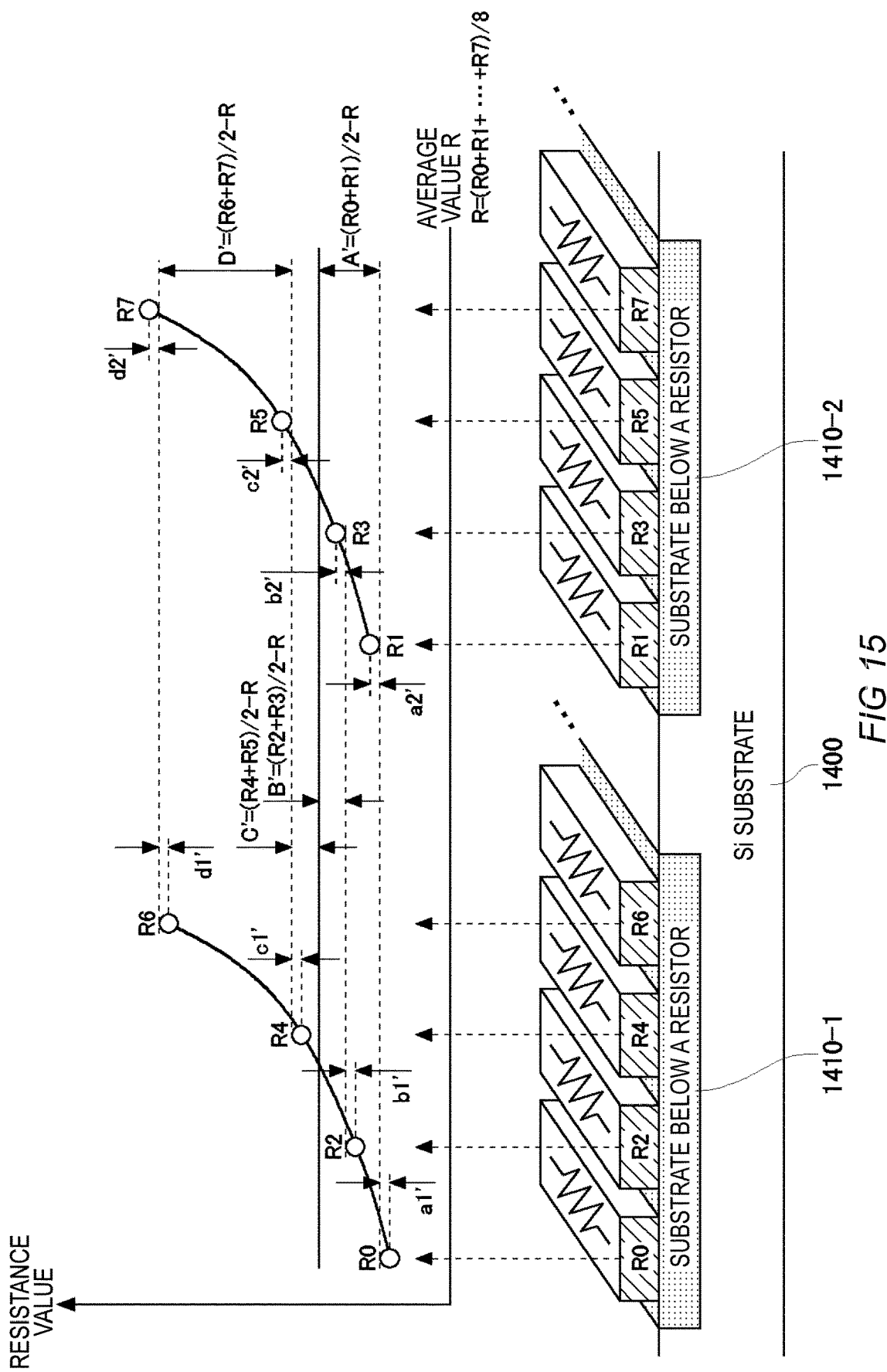
FIG. 15 shows an example of the relationship between the arrangement of the resistors R0 to R7 and the resistance values in the analog output circuit 190 according to a fourth modification example of the present embodiment.

FIG. 15 shows an example of the relationship between the arrangement of the resistors R0 to R7 and the resistance values in the analog output circuit 190 according to a fourth modification example of the present embodiment. In the example of the present drawing, the plurality of resistors R0, R2, R4, and R6 is formed on a substrate below a resistor 1410-1 for the P well, the N well, the trench, or the like formed on an upper surface of a substrate 1400 of silicon (Si) or the like. In addition, a plurality of resistors R1, R3, R5, and R7 is formed on a substrate below a resistor 1410-2 formed on the upper surface of the substrate 1400.

In the example shown in the present drawing, the substrate below a resistor 1410-1 and the substrate below a resistor 1410-2 thicken in a non-linear manner from a resistor R0 side and a resistor R1 side toward a resistor 6 side and a resistor R7 side. Therefore, for the respective resistors on the substrate below a resistor 1410-1 and the respective resistors on the substrate below a resistor 1410-2, the closer to the resistor R0 and R1 the resistors are, the smaller the resistance values are, and the closer to the resistor R6 and R7 the resistors are, the larger the resistance values are. The average resistance value of resistors R0 to R7 is R=(R0+ R1+ . . . +R7)/8.

Note that in the example shown in the present drawing, due to factors such as the configuration and the arrangement of the resistor array, the difference in resistance value is smaller between the resistors on the substrate below a resistor 1410-1, and the resistors physically arranged on the substrate below a resistor 1410-2 to correspond, than between the adjacent resistors on the substrate below a resistor 1410-1, and between the adjacent resistors on the substrate below a resistor 1410-2. For example, the difference in resistance value is smaller between the resistor R0 on the substrate below a resistor 1410-1, and the resistor R1 physically arranged on the substrate below a resistor 1410-2 to correspond (that is, located at a left end in each substrate below a resistor 1410) to the resistor R0, than between the adjacent resistors R0 and R2 on the substrate below a resistor 1410-1.

Therefore, in the present modification example, the plurality of resistors is grouped such that the difference in resistance value in the group is smaller regardless of the physical arrangement. The plurality of resistors may be grouped such that a sum of absolute values of the differences between the resistance values of the respective resistors, and the average resistance value of the resistors in the group is minimized. Specifically, the resistors R0 and R1, the resistors R2 and R3, the resistors R4 and R5, and the resistors R6 and R7, which are physically arranged to correspond to each other, are respectively grouped, and the mismatch is calculated for each group. In a case of such grouping, the mismatch of each resistor is similar to that shown in relation to FIG. 4.

Figure 16:
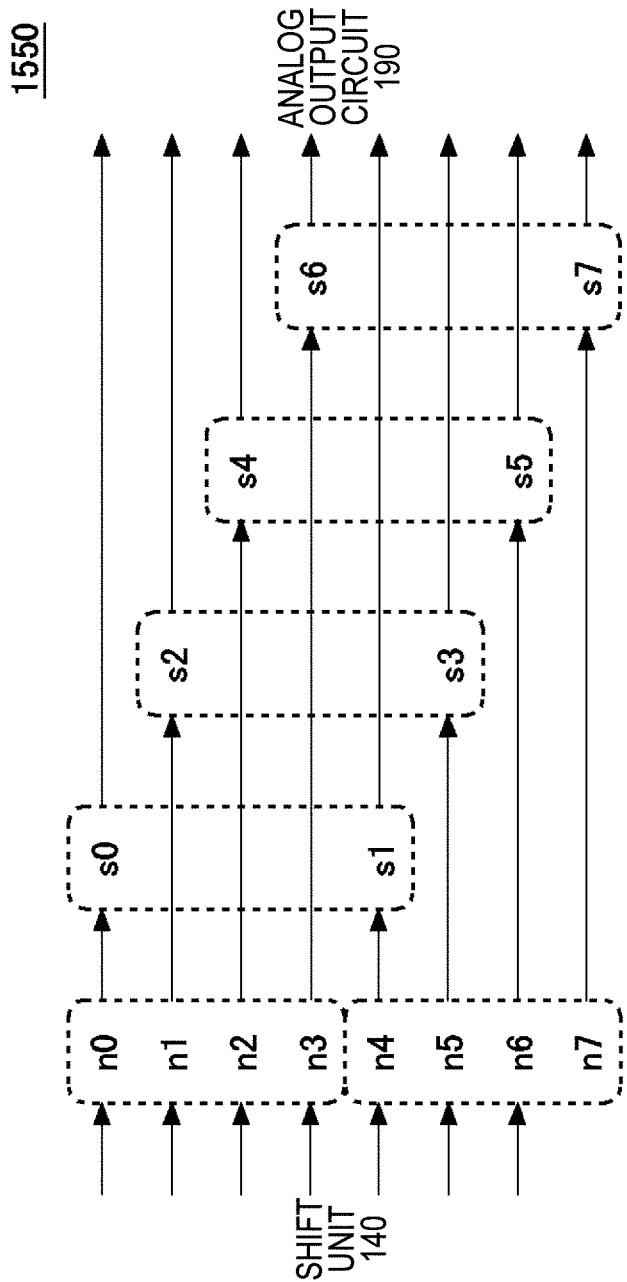
FIG. 16 shows a configuration of an arrangement conversion unit 1550 according to the fourth modification example of the present embodiment.

FIG. 16 shows a configuration of an arrangement conversion unit 1550 according to the fourth modification example of the present embodiment. The arrangement conversion unit 1550 is configured to supply, to the analog output circuit 190, the output control codes s7 to s0 obtained by converting the bit arrangement of the shifted codes n7 to no output by the shift unit 140. The shifted code in the present modification example is similar to the shifted code shown in relation to FIG. 4.

The output control code may include the plurality of converted bit fields, each of which has a consecutive predetermined second number of bits. In the example of the present drawing, the output control code S includes the four converted bit fields (s7 to s6, s5 to s4, s3 to s2, and s1 to s0), each of which has two consecutive bits. In the example of the present drawing, the output control code S is divided into a converted group S3 corresponding to the converted bit field s7 to s6; a converted group S2 corresponding to the converted bit field s5 to s4; a converted group S1 corresponding to the converted bit field s3 to s2; and a converted group S0 corresponding to the converted bit field s1 to s0.

As shown in FIG. 15, the plurality of resistors R0 to R7 in the analog output circuit 190 is grouped such that the difference in resistance value in the group is smaller. Accordingly, two consecutive bits s7 to s6, s5 to s4, s3 to s2, and s1 to s0 of the output control code S serve as signals for controlling the outputs of resistors R7 to R6, R5 to R4, R3 to R2, and R1 to R0, which are not physically arranged to be adjacent to each other, but are correspondingly located.

That is, the arrangement conversion unit 1550 is configured to perform the arrangement conversions on two bits having the same position in a bit field in the two unconverted bit fields, into two bits for controlling two analog converters that are physically arranged to correspond to each other in the same converted bit field. In the example of the present drawing, both of n4 in the unconverted bit field n7 to n4, and n0 in the unconverted bit field n3 to n0 is the least significant bit in the unconverted bit field, and is the bit whose position in the bit field is the same as each other. The arrangement conversion unit 1550 performs the arrangement conversions on these two bits n4 and n0 into the two adjacent bits s1 and s0 in the same converted bit field s1 to s0.

Similarly, the arrangement conversion unit 1550 performs the arrangement conversions on bits n5 and n1, which are second least significant bits in the two unconverted bit fields, into the two adjacent bits s3 and s2 in the same converted bit field s3 to s2. The arrangement conversion unit 1550 performs the arrangement conversions on bits n6 and n2, which are third least significant bits in the two unconverted bit fields, into the two adjacent bits s5 and s4 in the same converted bit field s5 to s4. The arrangement conversion unit 1550 performs the arrangement conversions on bits n7 and n3, which are fourth least significant bits in the two unconverted bit fields, into the two adjacent bits s7 and s6 in the same converted bit field s7 to s6. As a result, the arrangement conversion unit 1550 converts n0, n1, n2, n3, n4, n5, n6, and n7 of the unconverted bit fields, into s0, s2, s4, s6, s1, s3, s5, and s7 of the converted bit fields.

In the DA conversion apparatus 30 according to the present modification example, by the resistors, which are not physically arranged to be adjacent to each other, but whose relative positions correspond to each other in a mounting structure, being set as the same group to suppress the differences in resistance value between the resistors in the group, it is possible to suppress the width of the periodic fluctuation which occurs in the analog signal. Accordingly, with the DA conversion apparatus 30, instead of matching the resistance values of all the resistors included in the resistor array, it only needs to match the resistance values between the resistors in the group in which the number of resistors is (1/the number of groups of the resistors), and it is possible to reduce the matching requirement for each resistor in the resistor array in the analog output circuit 190.

In the DA conversion apparatus 30 described above, the shifted code N includes the two unconverted bit fields, and it is possible to suppress an unnecessary tone which is generated at a frequency with one period of the shifted code N as one period. Here, when the frequency of the clock signal is set as F(Hz), the number of bits of the shifted code N is set as K, and the value of the input digital signal Q+1 is set as V, the shifted code N of K bits per cycle is 1 for V bits, and thus a period of the shifted code N is made at a K/V cycle. Accordingly, the DA conversion apparatus 30 can suppress the unnecessary tone generated at a frequency of $F/(K/V)=F\cdot V/K$.

It should be noted that the case, where the input digital signal Q is 0 and one bit per cycle is selected for the output control code S, has been illustrated to simplify the above description. When the input digital signal Q is (k−1), and k bits per cycle are selected (note that k>1) for the output control code S, the analog signal output by the analog output circuit 190 can be regarded to have a value of k times a value in a case where one bit per 1/k cycle is selected. Accordingly, by suppressing the periodic fluctuation of the analog output signal in the case where the input digital signal Q is 0, it is possible to suppress the periodic fluctuation of the analog output signal even when the input digital signal Q is other than zero.

The DA conversion apparatus 30 shown above can be extended to include, as the shifted code N, the plurality of unconverted bit fields. That is, the shifted code N may include three unconverted bit fields or more. The number of unconverted bit fields may be, for example, a multiple of two, which is greater than or equal to three, or a power of two, which is greater than or equal to three. In this case, the arrangement conversion unit such as the arrangement conversion unit 150 performs the arrangement conversions on the plurality of bits having the same position in a bit field in the plurality of unconverted bit fields, to arrange the plurality of bits having the same position in a bit field, in the same converted bit field. According to states of the mismatches of the plurality of resistors, the arrangement conversion unit may perform the arrangement conversions on the plurality of bits having the same position in a bit field in the plurality of unconverted bit fields, into the plurality of bits for controlling the plurality of analog converters, which are physically arranged to be adjacent to each other, or are physically arranged to correspond to each other, in the same converted bit field.

For example, when the number of unconverted bit fields is 4, the arrangement conversion unit performs the arrangement conversions on the four bits having the same position in a bit field in the four unconverted bit fields in the shifted code N, to arrange the four bits in the same converted bit field. This makes it possible for the DA conversion apparatus 30 to also suppress the unnecessary tone generated at a frequency (2·F·V/K) with a period of ½ of the shifted code N as one period.

Various embodiments of the present invention may also be described with reference to flowcharts and block diagrams, where the blocks may represent (1) a stage of processing in which an operation is performed or (2) a section of a device that is responsible for performing the operation. Certain stages and sections may be implemented by dedicated circuitry, programmable circuitry supplied with computer-readable instructions stored on a computer-readable medium, and/or a processor supplied with computer-readable instructions stored on a computer-readable medium. The dedicated circuitry may include digital and/or analog hardware circuits, and may include integrated circuits (ICs) and/or discrete circuits. The programmable circuitry may include reconfigurable hardware circuits including memory elements such as logic AND, logic OR, logic XOR, logic NAND, logic NOR, and other logic operations, flip-flops, registers, field-programmable gate arrays (FPGA), programmable logic arrays (PLA), and the like.

The computer-readable medium may include any tangible device capable of storing instructions for execution by a suitable device, so that the computer-readable medium having the instructions stored therein will have a product including instructions that can be executed to create means for performing the operations designated in flowcharts or block diagrams. Examples of the computer-readable medium may include an electronic storage medium, a magnetic storage medium, an optical storage medium, an electromagnetic storage medium, a semiconductor storage medium, and the like. More specific examples of the computer-readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disc, a memory stick, an integrated circuit card, and the like.

The computer-readable instructions may include either source code or object code written in any combination of one or more programming languages, including assembler instructions, instruction-set-architecture (ISA) instructions, machine instructions, machine-dependent instructions, microcode, firmware instructions, state-setting data, or an object oriented programming language such as JAVA (registered trademark), C++, Smalltalk (registered trademark), or the like, and conventional procedural programming languages such as the "C" programming language or similar programming languages.

The computer-readable instructions may be provided for a processor or programmable circuitry of a general purpose computer, special purpose computer, or other programmable data processing devices such as a computer locally or via a wide area network (WAN) such as a local area network (LAN), the Internet, or the like, and execute the computer-readable instructions to create means for executing the operations designated in flowcharts or block diagrams. Examples of the processor include a computer processor, a processing unit, a microprocessor, a digital signal processor, a controller, a microcontroller, and the like.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: delta-sigma modulation apparatus
20: delta-sigma modulator
30: DA conversion apparatus
100: DWA circuit
110: delay circuit
120: thermometer conversion unit
130: shift amount storage unit
140: shift unit
150: arrangement conversion unit
160: update unit
190: analog output circuit
700: substrate
710: substrate below a resistor
850: arrangement conversion unit
1050: arrangement conversion unit
1150: arrangement conversion unit
1400: substrate
1410: substrate below a resistor
1150: arrangement conversion unit
1550: arrangement conversion unit

What is claimed is:

1. A Data Weighted Averaging (DWA) circuit comprising:
a thermometer conversion unit configured to convert an input digital signal into a thermometer code;
a shift amount storage unit configured to store a shift amount by which the thermometer code is to be cyclically shifted;
a shift unit configured to cyclically shift the thermometer code by the shift amount;
an arrangement conversion unit configured to supply, to an analog output circuit, an output control code obtained by converting a bit arrangement of a shifted code output by the shift unit; and
an update unit configured to update the shift amount according to a value of the input digital signal, wherein
the shifted code includes a plurality of unconverted bit fields, each of which has a consecutive predetermined first number of bits,
the output control code includes a plurality of converted bit fields, each of which has a consecutive predetermined second number of bits,
a number of the unconverted bit fields is smaller than a number of the converted bit fields, and
the arrangement conversion unit is configured to perform arrangement conversions on a plurality of bits having a same position in a bit field in the plurality of unconverted bit fields, to arrange the plurality of bits in a same converted bit field among the plurality of converted bit fields.

2. The DWA circuit according to claim 1, wherein
the arrangement conversion unit is configured to perform an arrangement conversion on at least one bit pair among a plurality of bit pairs of two bits from a least significant bit in each of the plurality of unconverted bit fields, into two converted bit fields, which are not adjacent to each other, among the plurality of converted bit fields.

3. The DWA circuit according to claim 1, wherein
the update unit is configured to update the shift amount according to the value of the input digital signal, for each period of the input digital signal.

4. The DWA circuit according to claim 1, wherein
the shifted code includes two unconverted bit fields, each of which has the first number of bits that are consecutive, and
the arrangement conversion unit is configured to perform the arrangement conversions on two bits having a same position in a bit field in the two unconverted bit fields, into a same converted bit field among the plurality of converted bit fields.

5. The DWA circuit according to claim 4, wherein
The arrangement conversion unit is configured to perform the arrangement conversions on two bits having a same position in a bit field in the two unconverted bit fields, into two adjacent bits in a same converted bit field among the plurality of converted bit fields.

6. The DWA circuit according to claim 4, wherein
the analog output circuit has, for each bit of the output control code, an analog converter that outputs an analog value corresponding to a value of the bit, and is configured to output a sum of analog values output by a plurality of the analog converters, as an analog signal corresponding to the input digital signal,
the plurality of analog converters is divided, according to a physical arrangement, into a plurality of groups, each of which has the second number of the analog converters, and
the plurality of converted bit fields corresponds to, on a one-to-one basis, the plurality of groups.

7. The DWA circuit according to claim 6, wherein
the arrangement conversion unit is configured to perform the arrangement conversions on two bits having a same position in a bit field in the two unconverted bit fields, into two bits for controlling two analog converters that are physically arranged to be adjacent to each other in a same converted bit field.

8. The DWA circuit according to claim 6, wherein
the arrangement conversion unit is configured to perform a conversion of a bit arrangement for setting a bit value which is based on an exclusive OR of a least significant bit and a most significant bit of binary values indicating bit positions in the shifted code, as a least significant bit of binary values indicating bit positions in the output control code.

9. The DWA circuit according to claim 6, wherein
the arrangement conversion unit is configured to perform arrangement conversions on two bits having a same position in a bit field in the two unconverted bit fields, into two bits for controlling two analog converters that are physically arranged to correspond to each other in a same converted bit field.

10. The DWA circuit according to claim 6, wherein
the plurality of groups consists of power-of-two groups.

11. The DWA circuit according to claim 1, wherein
the first number is four, and the second number is two.

12. The DWA circuit according to claim 1, wherein
the first number is eight, and the second number is four.

13. The DWA circuit according to claim 1, wherein
the shifted code includes a bit which does not belong to any of the plurality of unconverted bit fields, and
the arrangement conversion unit is configured to perform arrangement conversions on the bit which does not belong to any of the plurality of unconverted bit fields in the shifted code, into a bit which does not belong to any of the plurality of converted bit fields in the output control code.

14. The DWA circuit according to claim 13, wherein
a number of bits which do not belong to any of the plurality of unconverted bit fields in the shifted code is one.

15. A DA conversion apparatus comprising:
the DWA circuit according to claim 1; and
the analog output circuit.

16. A delta-sigma modulation apparatus comprising:
the DA conversion apparatus according to claim 15; and
a delta-sigma modulator configured to supply, to the DWA circuit of the DA conversion apparatus, the input digital signal obtained by performing a delta-sigma modulation on a digital signal which is a target of a DA conversion.

17. A Data Weighted Averaging (DWA) method comprising:
converting an input digital signal into a thermometer code;
storing, in a shift amount storage unit, a shift amount by which the thermometer code is to be cyclically shifted;
cyclically shifting the thermometer code by the shift amount;
supplying, to an analog output circuit, an output control code obtained by converting a bit arrangement of a shifted code obtained by cyclically shifting the thermometer code by the shift amount; and
updating the shift amount according to a value of the input digital signal, wherein
the shifted code includes a plurality of unconverted bit fields, each of which has a consecutive predetermined first number of bits,
the output control code includes a plurality of converted bit fields, each of which has a consecutive predetermined second number of bits,
a number of the unconverted bit fields is smaller than a number of the converted bit fields, and
in the converting of the bit arrangement, arrangement conversions on a plurality of bits having a same position in a bit field in the plurality of unconverted bit fields, to arrange the plurality of bits in a same converted bit field among the plurality of converted bit fields, are performed.

* * * * *